US012563667B2

(12) United States Patent
　　Tseng et al.

(10) Patent No.:　US 12,563,667 B2
(45) Date of Patent:　　Feb. 24, 2026

(54) MANUFACTURING METHOD OF CIRCUIT BOARD STRUCTURE

(71) Applicant: Unimicron Technology Corp., Taoyuan (TW)

(72) Inventors: Tzyy-Jang Tseng, Taoyuan City (TW); Cheng-Ta Ko, Taipei City (TW); Pu-Ju Lin, Hsinchu City (TW); Chi-Hai Kuo, Taoyuan City (TW); Shao-Chien Lee, Taoyuan City (TW); Ming-Ru Chen, Hsinchu City (TW); Cheng-Chung Lo, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 18/668,275

(22) Filed: May 20, 2024

(65) Prior Publication Data

US 2024/0306298 A1　　Sep. 12, 2024

Related U.S. Application Data

(60) Division of application No. 17/448,893, filed on Sep. 26, 2021, now Pat. No. 11,991,824, which is a
(Continued)

(30) Foreign Application Priority Data

Jan. 12, 2021　(TW) ................................. 110101060
Jul. 9, 2021　(TW) ................................. 110125380

(51) Int. Cl.
　　*H05K 1/11*　　　(2006.01)
　　*H05K 1/03*　　　(2006.01)
　　*H05K 3/00*　　　(2006.01)

(52) U.S. Cl.
　　CPC ........... *H05K 1/115* (2013.01); *H05K 1/0306* (2013.01); *H05K 3/0067* (2013.01); *H05K 3/0094* (2013.01)

(58) Field of Classification Search
　　CPC ...... H05K 1/02; H05K 1/0274; H05K 1/0306; H05K 1/115; H05K 1/186; H05K 3/0011;
(Continued)

(56) References Cited

U.S. PATENT DOCUMENTS 6,768,064 B2　7/2004　Higuchi et al.
8,222,631 B2　7/2012　Lee et al.
(Continued)

FOREIGN PATENT DOCUMENTS

CN　　101069459 A　　11/2007
CN　　105717690 A　　6/2016
(Continued)

OTHER PUBLICATIONS

Tzyy-Jang Tseng et al., "Circuit Board Structure and Manufacturing Method Thereof", U.S. Appl. No. 17/191,559, filed Mar. 3, 2021.

*Primary Examiner* — Dameon E Levi
(74) *Attorney, Agent, or Firm* — CKC & Partners Co., LLC

(57) ABSTRACT

A manufacturing method of a circuit board structure includes the following steps. A first sub-circuit board having an upper surface and a lower surface opposite to each other and including at least one conductive through hole is provided. A second sub-circuit board including at least one conductive through hole is provided on the upper surface of the first sub-circuit board. A third sub-circuit board including at least one conductive through hole is provided on the lower surface of the first sub-circuit board. The first sub-circuit board, the second sub-circuit board, and the third sub-circuit board are laminated so that at least two of their
(Continued)

conductive through holes are alternately arranged in an axial direction perpendicular to an extending direction of the first sub-circuit board. The first sub-circuit board, the second sub-circuit board, and the third sub-circuit board are electrically connected to one another.

5 Claims, 24 Drawing Sheets

Related U.S. Application Data continuation-in-part of application No. 17/191,559, filed on Mar. 3, 2021, now Pat. No. 11,540,396.

(60) Provisional application No. 63/071,369, filed on Aug. 28, 2020.

(58) Field of Classification Search
CPC .... H05K 3/0067; H05K 3/0094; H05K 3/361; H10K 59/12; H10K 59/123; H10K 59/124; H10K 59/131; H10K 59/1201; H10K 59/1213; H10K 59/78696; H01L 27/124; H01L 27/1218; H01L 27/1248; H01L 27/1259; H01L 27/1266; H01L 27/1288; H01L 29/41733; H01L 29/42384; H01L 29/66969; H01L 29/7869; H01L 29/78633; H01L 29/78675
USPC .................. 174/262; 361/803; 438/104, 106; 257/43, 686, 734; 29/830, 852
See application file for complete search history.

(56) References Cited

U.S. PATENT DOCUMENTS

| | | | | |
|---|---|---|---|---|
| 12,032,216 | B2 * | 7/2024 | Brusberg | G02B 6/423 |
| 2004/0041243 | A1 | 3/2004 | Ogawa | |
| 2005/0012217 | A1 | 1/2005 | Mori et al. | |
| 2005/0029936 | A1 * | 2/2005 | Kim | H10K 50/824 |
| | | | | 313/506 |
| 2006/0088953 | A1 * | 4/2006 | Ho | H01L 24/29 |
| | | | | 257/E21.511 |
| 2007/0045841 | A1 | 3/2007 | Cho et al. | |
| 2007/0264750 | A1 | 11/2007 | Tseng | |
| 2008/0142940 | A1 * | 6/2008 | Dunne | H05K 1/186 |
| | | | | 257/E21.001 |
| 2010/0321916 | A1 * | 12/2010 | Yoshida | H05K 3/361 |
| | | | | 29/830 |
| 2011/0294244 | A1 * | 12/2011 | Hattori | H01L 27/1262 |
| | | | | 438/34 |
| 2012/0161311 | A1 * | 6/2012 | Miyasaka | H01L 23/49894 |
| | | | | 257/734 |
| 2013/0071615 | A1 | 3/2013 | Murata et al. | |
| 2013/0174417 | A1 * | 7/2013 | Yu | H01L 21/76898 |
| | | | | 29/852 |
| 2014/0146500 | A1 | 5/2014 | Shimizu et al. | |
| 2014/0346504 | A1 * | 11/2014 | Misaki | H01L 27/1248 |
| | | | | 257/43 |
| 2015/0312501 | A1 * | 10/2015 | Fahim | H01L 27/14661 |
| | | | | 348/294 |
| 2015/0340511 | A1 * | 11/2015 | Yan | H01L 27/1225 |
| | | | | 257/43 |
| 2017/0010493 | A1 * | 1/2017 | Yu | G06F 3/0443 |
| 2017/0101521 | A1 * | 4/2017 | Koyama | G03F 7/004 |
| 2017/0194377 | A1 * | 7/2017 | Guo | H01L 27/14692 |
| 2017/0230597 | A1 * | 8/2017 | Fahim | H01L 27/14634 |
| 2017/0357134 | A1 * | 12/2017 | Wang | G02F 1/136209 |
| 2018/0079864 | A1 * | 3/2018 | Kawabata | H01L 23/293 |
| 2018/0081470 | A1 * | 3/2018 | Li | G06F 3/0443 |
| 2018/0118887 | A1 * | 5/2018 | Shibuya | C08G 73/1042 |
| 2018/0215874 | A1 * | 8/2018 | Kawabata | G03F 7/20 |
| 2018/0222164 | A1 * | 8/2018 | Iwai | G03F 7/40 |
| 2019/0244927 | A1 * | 8/2019 | Lin | C09D 179/085 |
| 2019/0289715 | A1 * | 9/2019 | Iwai | H01L 21/486 |
| 2019/0312122 | A1 * | 10/2019 | Morita | H01L 23/49827 |
| 2020/0089113 | A1 * | 3/2020 | Kawabata | G03F 7/037 |
| 2020/0105663 | A1 * | 4/2020 | Tsai | H01L 23/5389 |
| 2020/0135772 | A1 * | 4/2020 | Lee | H01L 27/1255 |
| 2021/0202530 | A1 * | 7/2021 | Yao | H01L 27/124 |
| 2022/0308376 | A1 | 9/2022 | Liu | |

FOREIGN PATENT DOCUMENTS

| | | |
|---|---|---|
| CN | 107887403 A | 4/2018 |
| CN | 110891368 A | 3/2020 |
| CN | 111564436 A | 8/2020 |
| JP | 2017005174 A | 1/2017 |
| KR | 101563302 B1 | 10/2015 |
| TW | 200524503 A | 7/2005 |
| TW | 200610471 A | 3/2006 |
| TW | 202101732 A | 1/2021 |
| TW | 202114121 A | 4/2021 |

* cited by examiner

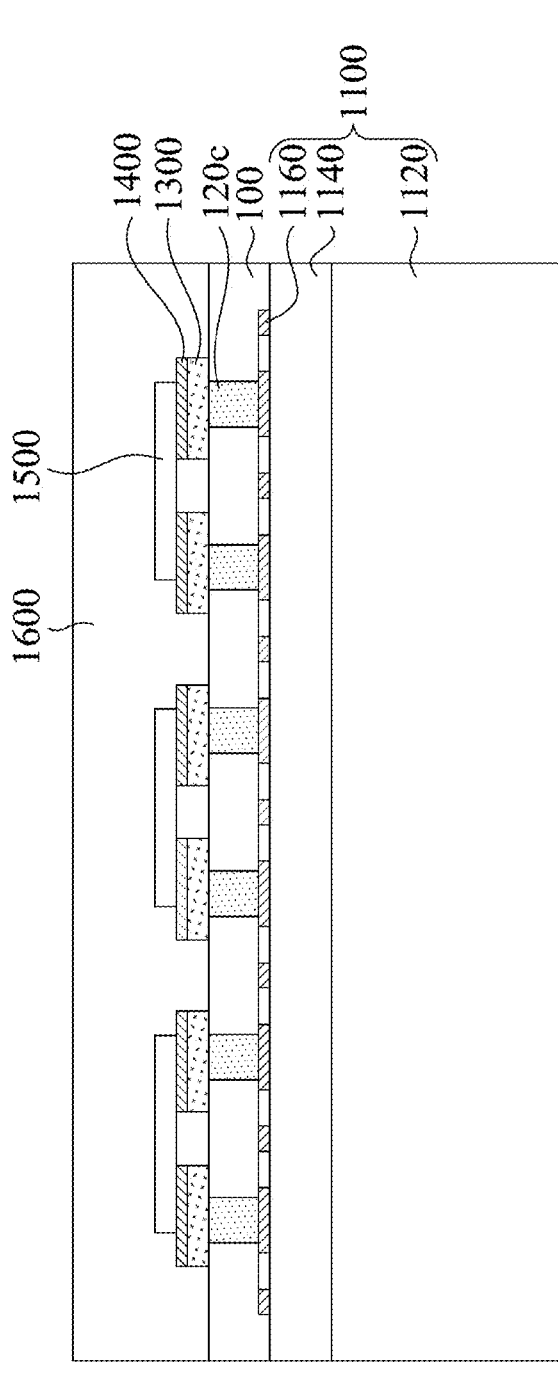
Fig. 5

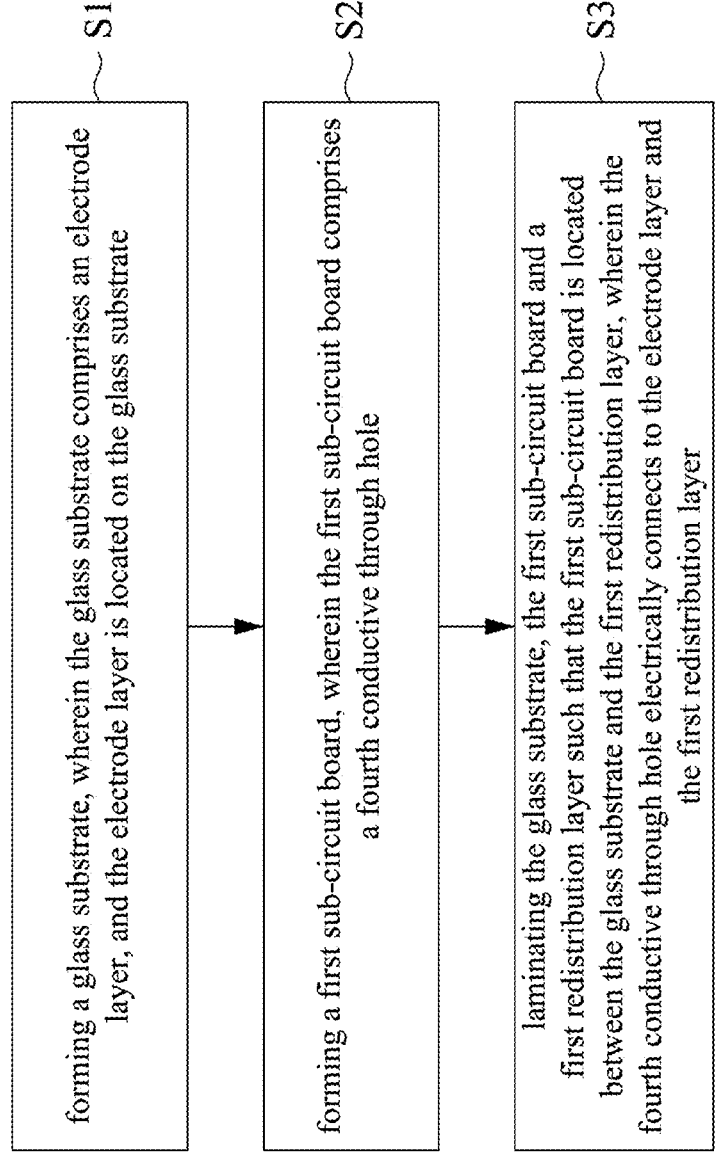

forming a glass substrate, wherein the glass substrate comprises an electrode layer, and the electrode layer is located on the glass substrate — S1 forming a first sub-circuit board, wherein the first sub-circuit board comprises a fourth conductive through hole — S2 laminating the glass substrate, the first sub-circuit board and a first redistribution layer such that the first sub-circuit board is located between the glass substrate and the first redistribution layer, wherein the fourth conductive through hole electrically connects to the electrode layer and the first redistribution layer — S3

Fig. 7

MANUFACTURING METHOD OF CIRCUIT BOARD STRUCTURE

CROSS-REFERENCE TO RELATED APPLICATION

This application is a Divisional Application of U.S. application Ser. No. 17/448,893 filed on Sep. 26, 2021, now patented as U.S. Pat. No. 11,991,824, issued May 21, 2024, which is a Continuation-in-part of U.S. application Ser. No. 17/191,559, filed on Mar. 3, 2021, now patented as U.S. Pat. No. 11,540,396, issued Dec. 27, 2022, which claims priority to U.S. Provisional Application Ser. No. 63/071,369, filed on Aug. 28, 2020, and Taiwan Application Serial Number 110101060, filed on Jan. 12, 2021. The prior U.S. application Ser. No. 17/448,893 claims priority to Taiwan Application Serial Number 110125380, filed on Jul. 9, 2021. All the aforementioned earlier applications are herein incorporated by reference in their entireties.

BACKGROUND

Field of Invention

The invention relates to a circuit board structure and a manufacturing method thereof, and more particularly to a circuit board structure and a manufacturing method thereof that may reduce costs.

Description of Related Art

In general, two circuit boards having circuits or conductive structures are connected to each other via a solder-free block, and an underfill is used to fill the gap between the two substrates to seal the solder-free block. However, during the process of high-temperature reflow of the solder, the circuit board with a larger area size cannot be released due to stress, and larger warpage is likely to occur, thereby reducing the assembly yield between the two circuit boards.

SUMMARY

The invention provides a manufacturing method of a circuit board structure for manufacturing the above circuit board structure.

A manufacturing method of a circuit board structure of the invention includes the following steps. A first sub-circuit board is provided. The first sub-circuit board has an upper surface and a lower surface opposite to each other, and includes at least one first conductive through hole. A second sub-circuit board is provided on the upper surface of the first sub-circuit board. The second sub-circuit board includes at least one second conductive through hole. A third sub-circuit board is provided on the lower surface of the first sub-circuit board. The third sub-circuit board includes at least one third conductive through hole. The first sub-circuit board, the second sub-circuit board, and the third sub-circuit board are laminated so that at least two of the first conductive through hole, the second conductive through hole, and the third conductive through hole are alternately arranged in an axial direction perpendicular to an extending direction of the first sub-circuit board. The first sub-circuit board, the second sub-circuit board, and the third sub-circuit board are electrically connected to one another.

In an embodiment of the invention, the first sub-circuit board further includes a substrate having an upper surface and a lower surface. The first conductive through hole penetrates the substrate. Before the first sub-circuit board, the second sub-circuit board, and the third sub-circuit board are laminated, the substrate is in a B-stage state. After the first sub-circuit board, the second sub-circuit board, and the third sub-circuit board are laminated, the substrate is transformed from the B-stage state to a C-stage state.

Based on the above, in the circuit board structure and the manufacturing method thereof of the invention, the circuit board structure is formed by laminating the first sub-circuit board, the second sub-circuit board, and the third sub-circuit board. At least two of the first conductive through hole, the second conductive through hole, and the third conductive through hole are alternately arranged in the axial direction perpendicular to the extending direction of the first sub-circuit board, and the first sub-circuit board, the second sub-circuit board, and the third sub-circuit board are electrically connected to one another via the first conductive through hole, the second conductive through hole, and the third conductive through hole. Thereby, the manufacturing method of the circuit board structure of the invention does not need to use solder and underfill, thus effectively reducing the manufacturing cost of the circuit board structure. Moreover, since solder is not used, the bonding yield among the first sub-circuit board, the second sub-circuit board, and the third sub-circuit board may be effectively improved, thereby improving the structural reliability of the circuit board structure of the invention.

According to an embodiment of the present disclosure, a circuit board structure includes a glass substrate, an electrode layer, a first sub-circuit board and a first redistribution layer. The electrode layer is located on the glass substrate. The first sub-circuit board is located on the glass substrate and the electrode layer. The first sub-circuit board includes a fourth conductive through hole. The fourth conductive through hole is located in the first sub-circuit board and on the electrode layer. The first redistribution layer is located on the first sub-circuit board and the fourth conductive through hole. The fourth conductive through hole electrically connects to the electrode layer and the first redistribution layer.

In an embodiment of the present disclosure, the circuit board structure further includes an antioxidant layer, a pixel unit and a mold. The antioxidant layer is located on the first redistribution layer. The antioxidant layer is made of a material that includes gold. The pixel unit is located on the antioxidant layer. The mold is located on the pixel layer, the antioxidant layer and the first sub-circuit board.

In an embodiment of the present disclosure, the circuit board structure further includes a dielectric layer, a second redistribution layer, an antioxidant layer, a pixel layer and a mold. The dielectric layer is located on the first sub-circuit board and the first redistribution layer. The second redistribution layer is located on the dielectric layer and extending to the first redistribution layer. The antioxidant layer is located on the second redistribution layer. The antioxidant layer is made of a material that includes gold. The pixel layer is located on the antioxidant layer. The mold located on the pixel layer, the antioxidant layer and the dielectric layer.

In an embodiment of the present disclosure, the circuit board structure further includes a thin-film transistor layer. The thin-film transistor layer is located between the glass substrate and the electrode layer.

According to an embodiment of the present disclosure, a manufacturing method of a circuit board structure includes: forming a glass substrate, wherein the glass substrate comprises an electrode layer, and the electrode layer is located on the glass substrate; forming a first sub-circuit board, wherein the first sub-circuit board comprises a fourth conductive through hole; and laminating the glass substrate, the first sub-circuit board and a first redistribution layer such that the first sub-circuit board is located between the glass substrate and the first redistribution layer, wherein the fourth conductive through hole electrically connects to the electrode layer and the first redistribution layer.

In an embodiment of the present disclosure, before laminating the glass substrate, the first sub-circuit board and the first redistribution layer, the first sub-circuit board is in a B-stage state, and the method further includes performing a hot pressing method to transform the first sub-circuit board from the B-stage state to a C-stage state after laminating the glass substrate, the first sub-circuit board and the first redistribution layer.

In an embodiment of the present disclosure, the method further includes: patterning the first redistribution layer; forming an antioxidant layer on the first redistribution layer by electroless plating, wherein the antioxidant layer is made of a material that includes gold; disposing a pixel unit on the antioxidant layer; and forming a mold on the pixel unit, the antioxidant layer and the first sub-circuit board.

In an embodiment of the present disclosure, before laminating the glass substrate, the first sub-circuit board and the first redistribution layer, the method further includes: patterning the first redistribution layer; forming a dielectric layer on the first redistribution layer; forming an opening in the dielectric layer; forming a second redistribution layer on the dielectric layer; wherein the second redistribution layer extends to the first redistribution layer in the opening.

In an embodiment of the present disclosure, the method further includes: forming an antioxidant layer on the second redistribution layer by electroless plating, wherein the antioxidant layer is made of a material that includes gold; disposing a pixel unit on the antioxidant layer; and forming a mold on the pixel unit, the antioxidant layer and the dielectric layer.

In an embodiment of the present disclosure, forming the first sub-circuit board includes: laser-drilling the first sub-circuit board such that the first sub-circuit board has a through hole; and filling the through hole with a conductive metal adhesive to form the fourth conductive through hole in the first sub-circuit board.

In the aforementioned embodiments of the present disclosure, the first sub-circuit board of the circuit board structure may bond to the electrode layer and the first redistribution layer, that is, the first sub-circuit board may be regarded as a connection structure for bonding to the electrode layer and the first redistribution layer to improve a bonding force. Moreover, since the conductive through hole of the first sub-circuit board only needs to be filled with the conductive metal adhesive to connect with the electrode layer and the first redistribution layer, which is no need to perform an electroplating process to fill the conductive through hole. It may save the cost of using electroplating equipment and be environmental. In addition, the conductive through hole of the first sub-circuit board is connected to the electrode layer and the first redistribution layer by filling with the conductive metal adhesive, instead of performing the electroplating process to fill the conductive through hole. Stress may be reduced when the first sub-circuit board bonds to the electrode layer and the first redistribution layer, and the glass substrate will not be curved. The first sub-circuit board and the first redistribution layer may be used as bonding pads to provide a stable effect for the pixel unit. Compared with the traditional technology, the first redistribution layer has a better bonding force to metal, and the first redistribution layer may be used as a bonding pad, so a structural reliability between the first redistribution layer and the pixel unit may increase.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a cross-sectional view of a circuit board structure according to one embodiment of the present disclosure.

FIG. 7 is a flow chart of a manufacturing method of a circuit board structure according to one embodiment of the present disclosure.

DETAILED DESCRIPTION

Figure 1A:
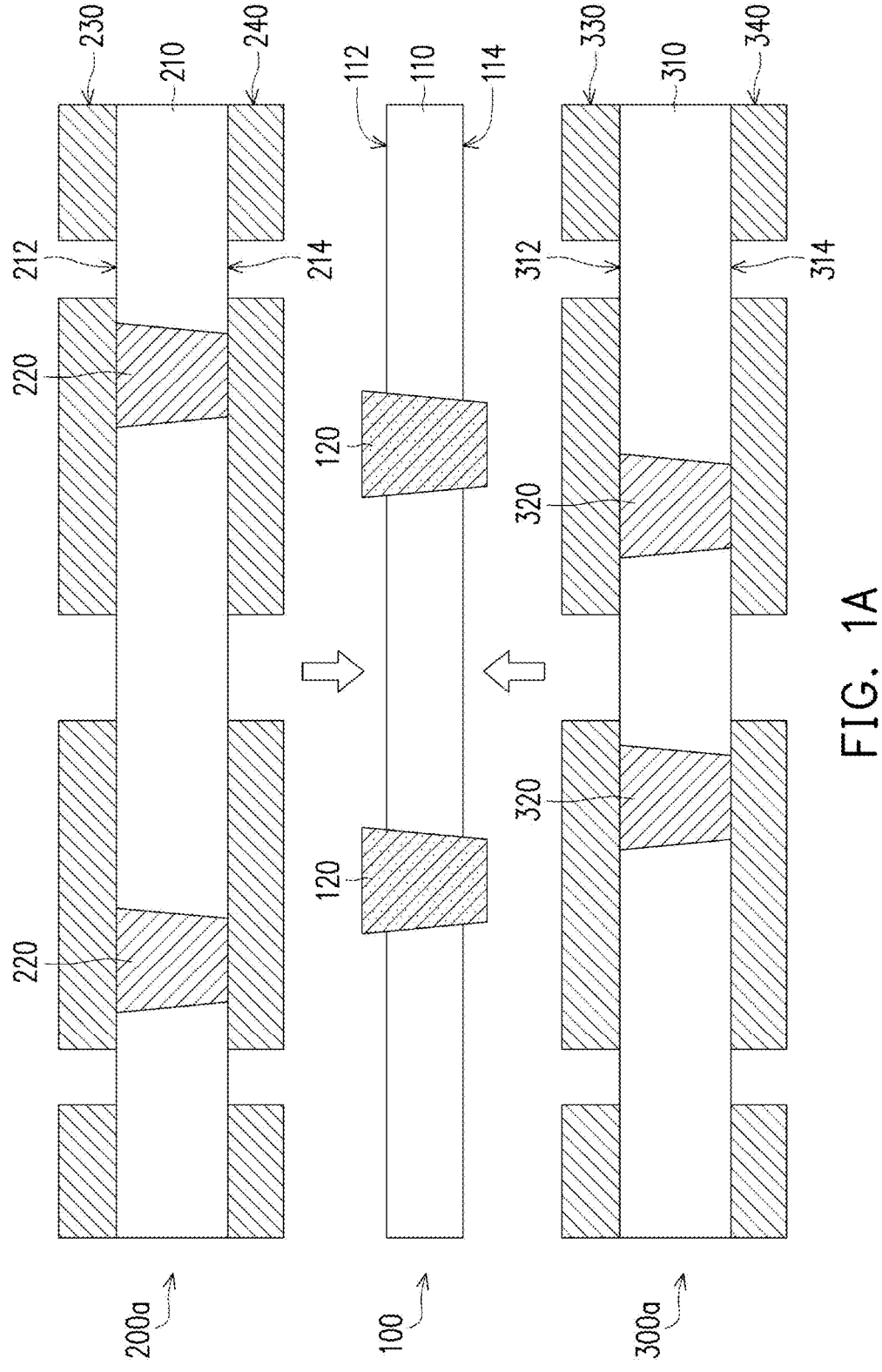
FIG. 1A to FIG. 1B are schematic cross-sectional views of a manufacturing method of a circuit board structure according to an embodiment of the invention.
Figure 1B:
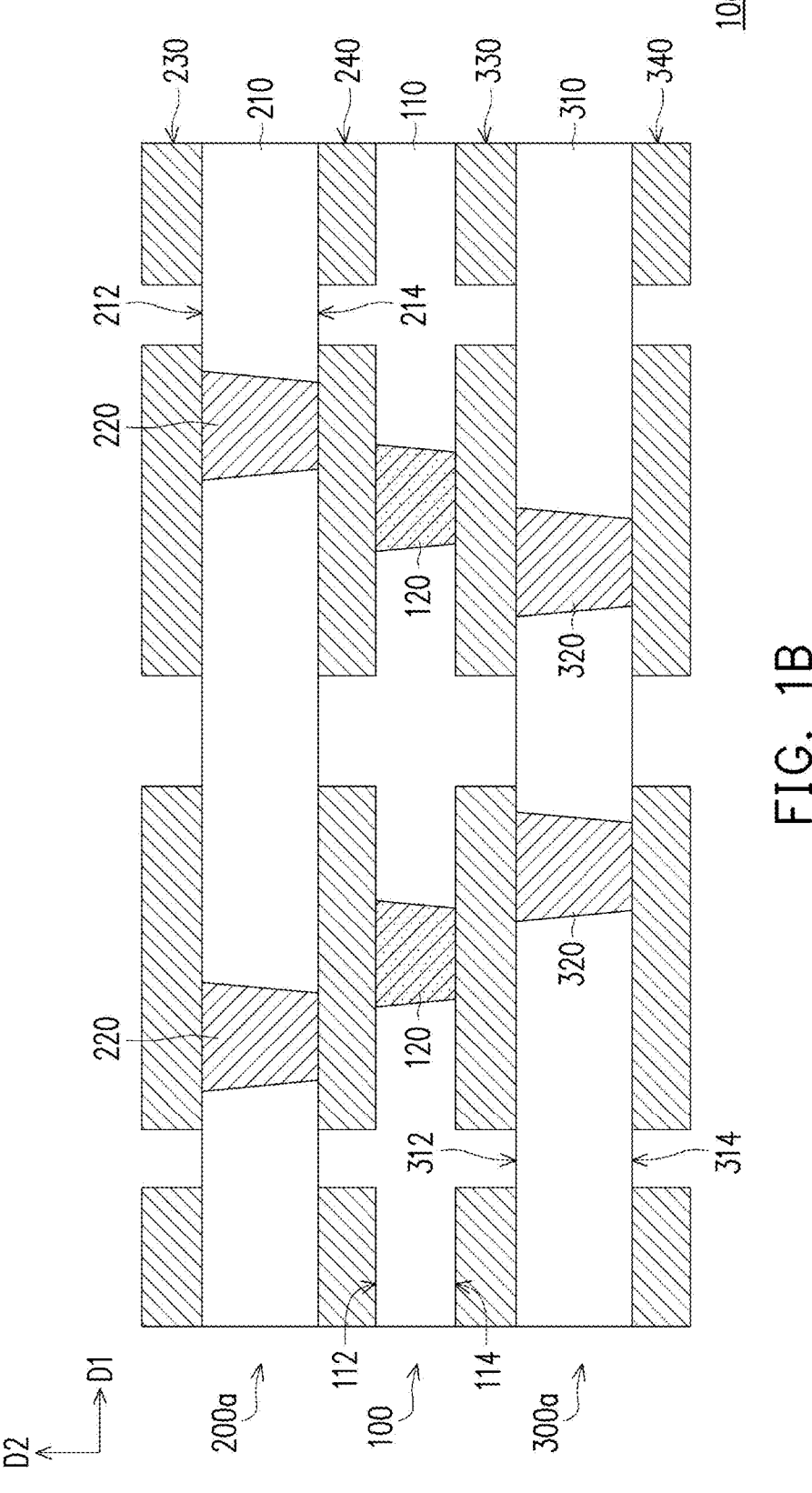

FIG. 1A to FIG. 1B are schematic cross-sectional views of a manufacturing method of a circuit board structure according to an embodiment of the invention. Regarding the manufacturing method of the circuit board structure of the present embodiment, first, referring to FIG. 1A, a first sub-circuit board 100 is provided. In detail, the first sub-circuit board 100 includes a substrate 110 and at least one first conductive through hole (two first conductive through holes 120 are schematically shown). The substrate 110 has an upper surface 112 and a lower surface 114 opposite to each other. The first conductive through holes 120 penetrate the substrate 110 and are protruded beyond the upper surface 112 and the lower surface 114. At this time, the substrate 110 is in a B-stage state, that is, the substrate 110 is in an incompletely cured state. Here, the material of the substrate 110 includes polypropylene (PP), and the material of the first conductive through holes 120 is, for example, a conductive metal adhesive manufactured by transient liquid phase sintering (TLPS) coating and has the effects of electrical and thermal conductivity, and is suitable for joining with any metal material, and is not converted back to liquid by heat.

Next, referring to FIG. 1A again, a second sub-circuit board 200a is provided on the upper surface 112 of the first sub-circuit board 100. Specifically, the second sub-circuit board 200a includes a first substrate 210, at least one second conductive through hole (two second conductive through holes 220 are schematically shown), a first circuit layer 230, and a second circuit layer 240. The first substrate 210 has a first surface 212 and a second surface 214 opposite to each other. The second conductive through holes 220 penetrate the first substrate 210. The first circuit layer 230 is disposed on the first surface 212 of the first substrate 210 and exposes a portion of the first surface 212. The second circuit layer 240 is disposed on the second surface 214 of the first substrate 210 and exposes a portion of the second surface 214. The first circuit layer 230 and the second circuit layer 240 are electrically connected via the second conductive through holes 220. At this time, the second sub-circuit board 200a is in a C-stage state, that is, the second sub-circuit board 200a is in a completely cured state.

Then, a third sub-circuit board 300a is provided on the lower surface 114 of the first sub-circuit board 100. Specifically, the third sub-circuit board 300a includes a second substrate 310, at least one third conductive through hole (two third conductive through holes 320 are schematically shown), a third circuit layer 330, and a fourth circuit layer 340. The second substrate 310 has a third surface 312 and a fourth surface 314 opposite to each other, and the third conductive through holes 320 penetrate the second substrate 310. The third circuit layer 330 is disposed on the third surface 312 of the second substrate 310 and exposes a portion of the third surface 312. The fourth circuit layer 340 is disposed on the fourth surface 314 of the second substrate 310 and exposes a portion of the fourth surface 314. The third circuit layer 330 and the fourth circuit layer 340 are electrically connected via the third conductive through holes 320. At this time, the third sub-circuit board 300a is in a C-stage state, that is, the third sub-circuit board 300a is in a completely cured state.

Next, referring to FIG. 1A and FIG. 1B at the same time, the first sub-circuit board 100, the second sub-circuit board 200a, and the third sub-circuit board 300a are laminated by a hot pressing method so that at least two of the first conductive through holes 120, the second conductive through holes 220, and the third conductive through holes 320 are alternately arranged in an axial direction D2 perpendicular to an extending direction D1 the first sub-circuit board 100. Here, the first conductive through holes 120, the second conductive through holes 220, and the third conductive through holes 320 are alternately arranged in the axial direction D2. That is, the first conductive through holes 120, the second conductive through holes 220, and the third conductive through holes 320 are not on the same axis. During hot pressing, the second circuit layer 240 of the second sub-circuit board 200a is directly in contact with the upper surface 112 of the substrate 110 and squeezes the first conductive through holes 120 so that the first conductive through holes 120 are deformed. The third circuit layer 330 of the third sub-circuit board 300a is directly in contact with the lower surface 114 of the substrate 110 and squeezes the first conductive through holes 120 so that the first conductive through holes 120 are deformed. At this point, since the substrate 110 is not completely cured and has flexibility and adhesiveness, the substrate 110 may be bonded to the second circuit layer 240 and the third circuit layer 330 and squeezed onto the second surface 214 exposed by the second circuit layer 240 and onto the third surface 312 exposed by the third circuit layer 330. After lamination and curing, the substrate 110 of the first sub-circuit board 100 is transformed from the B-stage state to the C-stage state. That is, the first sub-circuit board 100 is in a completely cured state, so that the first sub-circuit board 100, the second sub-circuit board 200a, and the third sub-circuit board 300a are firmly joined together. In other words, the first sub-circuit board 100 may be regarded as a connection structure for joining the second sub-circuit board 200a and the third sub-circuit board 300a.

As shown in FIG. 1B, the second circuit layer 240 of the second sub-circuit board 200a is electrically connected to the first conductive through holes 120 of the first sub-circuit board 100. The third circuit layer 330 of the third sub-circuit board 300a is electrically connected to the first conductive through holes 120 of the first sub-circuit board 100. In other words, the first sub-circuit board 100, the second sub-circuit board 200a, and the third sub-circuit board 300a are electrically connected to one another via the first conductive through holes 120, the second conductive through holes 220, and the third conductive through holes 320. At this point, the manufacture of the circuit board structure 10a is complete.

In short, in the present embodiment, the circuit board structure 10a is formed by laminating the first sub-circuit board 100, the second sub-circuit board 200a, and the third sub-circuit board 300a. The first conductive through holes 120, the second conductive through holes 220, and the third conductive through holes 320 are alternately arranged in the axial direction D2 perpendicular to the extending direction D1 of the first sub-circuit board 100, and the first sub-circuit board 100, the second sub-circuit board 200a, and the third sub-circuit board 300a are electrically connected to one another via the first conductive through holes 120, the second conductive through holes 220, and the third conductive through holes 320. Thereby, the manufacturing method of the circuit board structure 10a of the present embodiment does not need to use solder and underfill, thus effectively reducing the manufacturing cost of the circuit board structure 10a. Moreover, since solder is not used, the bonding yield among the first sub-circuit board 100, the second sub-circuit board 200a, and the third sub-circuit board 300a may be effectively improved, thereby improving the structural reliability of the circuit board structure 10a of the present embodiment.

It should be mentioned here that, the following embodiments adopt the reference numerals of the embodiment above and a portion of the content thereof, wherein the same reference numerals are used to represent the same or similar devices and descriptions of the same technical content are omitted. The omitted portions are as described in the embodiments above and are not repeated in the embodiments below.

Figure 2A:
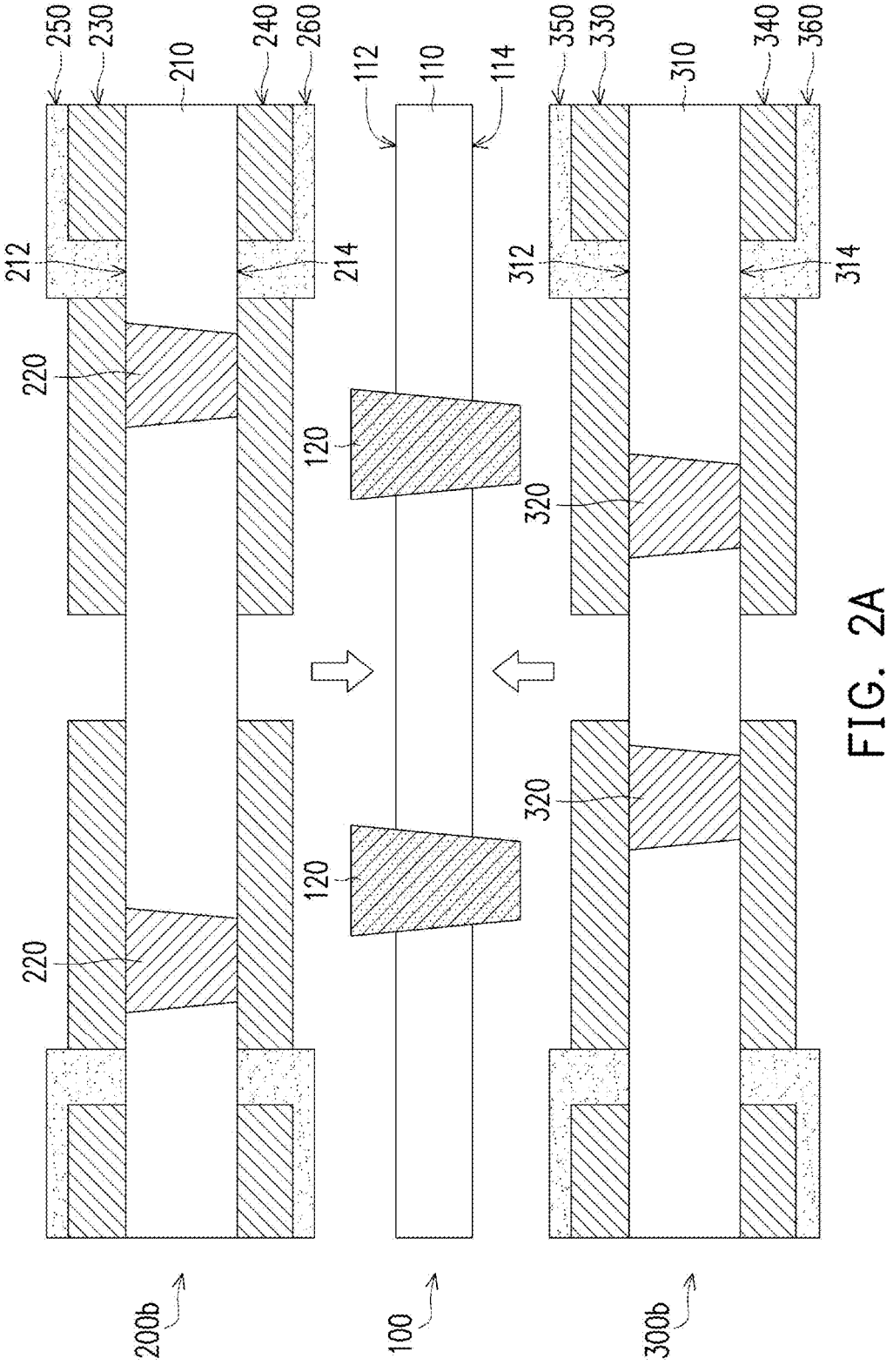
FIG. 2A to FIG. 2B are schematic cross-sectional views of a manufacturing method of a circuit board structure according to another embodiment of the invention.
Figure 2B:
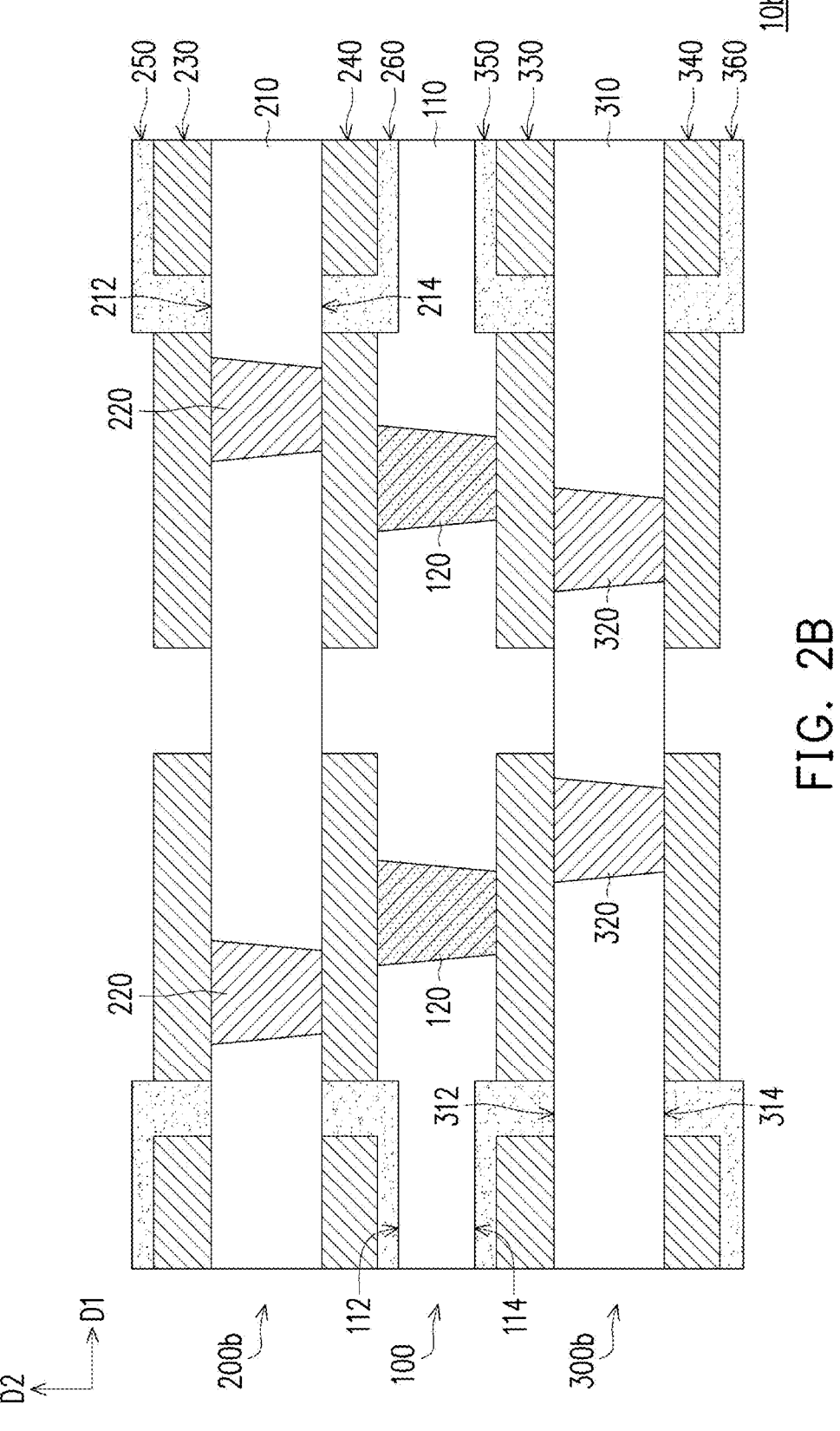

FIG. 2A to FIG. 2B are schematic cross-sectional views of a manufacturing method of a circuit board structure according to another embodiment of the invention. Referring first to FIG. 2A and FIG. 1A at the same time, the manufacturing method of a circuit board structure 10b of the present embodiment is similar to the manufacturing method of the circuit board structure 10a, and the difference between the two is: in the present embodiment, the second sub-circuit board 200*b* further includes a first solder mask 250 and a second solder mask 260. The first solder mask 250 is disposed on the first surface 212 exposed by the first circuit layer 230, and extended to cover a portion of the first circuit layer 230. The second solder mask 260 is disposed on the second surface 214 exposed by the second circuit layer 240, and extended to cover a portion of the second circuit layer 240. Moreover, the third sub-circuit board 300*b* further includes a first solder mask 350 and a second solder mask 360. The first solder mask 350 is disposed on the third surface 312 exposed by the third circuit layer 330, and extended to cover a portion of the third circuit layer 330. The second solder mask 360 is disposed on the fourth surface 314 exposed by the fourth circuit layer 340, and extended to cover a portion of the fourth circuit layer 340.

Referring to FIG. 2A and FIG. 2B at the same time, when the first sub-circuit board 100, the second sub-circuit board 200*b*, and the third sub-circuit board 300*b* are laminated to form the circuit board structure 10*b*, since the substrate 110 is not completely cured and has flexibility and adhesiveness, the substrate 110 may be bonded to the second solder mask 260 of the second sub-circuit board 200*b* and the first solder mask 350 of the third sub-circuit board 300*b* and squeezed onto the second surface 214 exposed by the second circuit layer 240 and onto the third surface 312 exposed by the third circuit layer 330. At this point, the second circuit layer 240 of the second sub-circuit board 200*b* is directly in contact with the upper surface 112 of the substrate 110 and squeezes the first conductive through holes 120 so that the first conductive through holes 120 are deformed. The third circuit layer 330 of the third sub-circuit board 300*b* is directly in contact with the lower surface 114 of the substrate 110 and squeezes the first conductive through holes 120 so that the first conductive through holes 120 are deformed. The first sub-circuit board 100, the second sub-circuit board 200*b*, and the third sub-circuit board 300*b* are electrically connected to one another via the first conductive through holes 120, the second conductive through holes 220, and the third conductive through holes 320.

In short, the first sub-circuit board 100 of the present embodiment may be regarded as an interposer, and the state of the substrate 110 is changed by a hot pressing method so that the second solder mask 260 and the second circuit layer 240 of the second sub-circuit board 200*b* and the first solder mask 350 and the third circuit layer 330 of the third sub-circuit board 300*b* are directly bonded on the upper surface 112 and the lower surface 114 of the substrate 110. Thereby, no solder and underfill are needed, and the manufacturing cost of the circuit board structure 10*b* may be effectively reduced. Moreover, since solder is not used, the bonding yield among the first sub-circuit board 100, the second sub-circuit board 200*b*, and the third sub-circuit board 300*b* may be effectively improved, thereby improving the structural reliability of the circuit board structure 10*b* of the present embodiment.

Figure 3A:
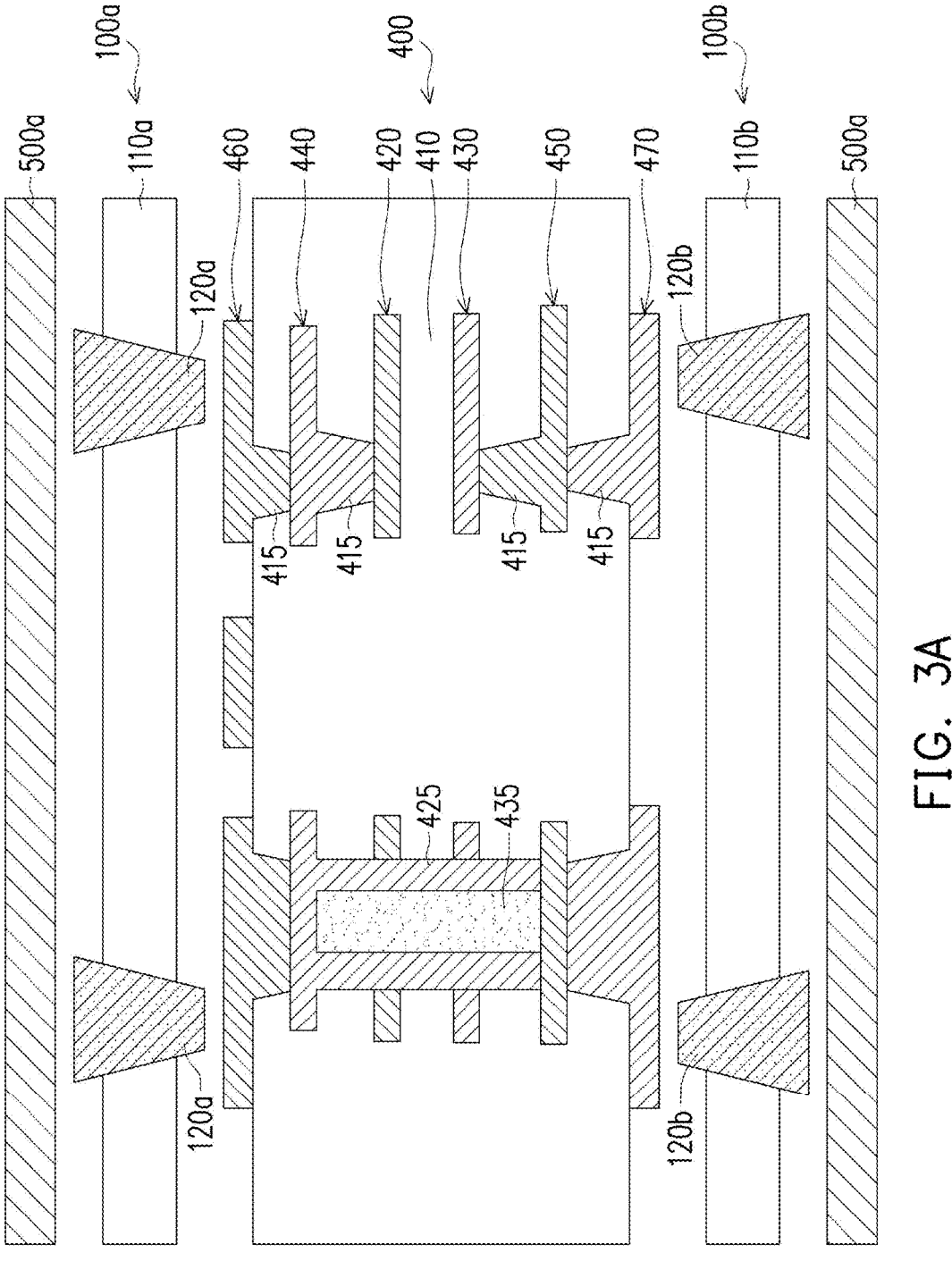
FIG. 3A to FIG. 3C are schematic cross-sectional views of a manufacturing method of a circuit board structure according to another embodiment of the invention.
Figure 3B:
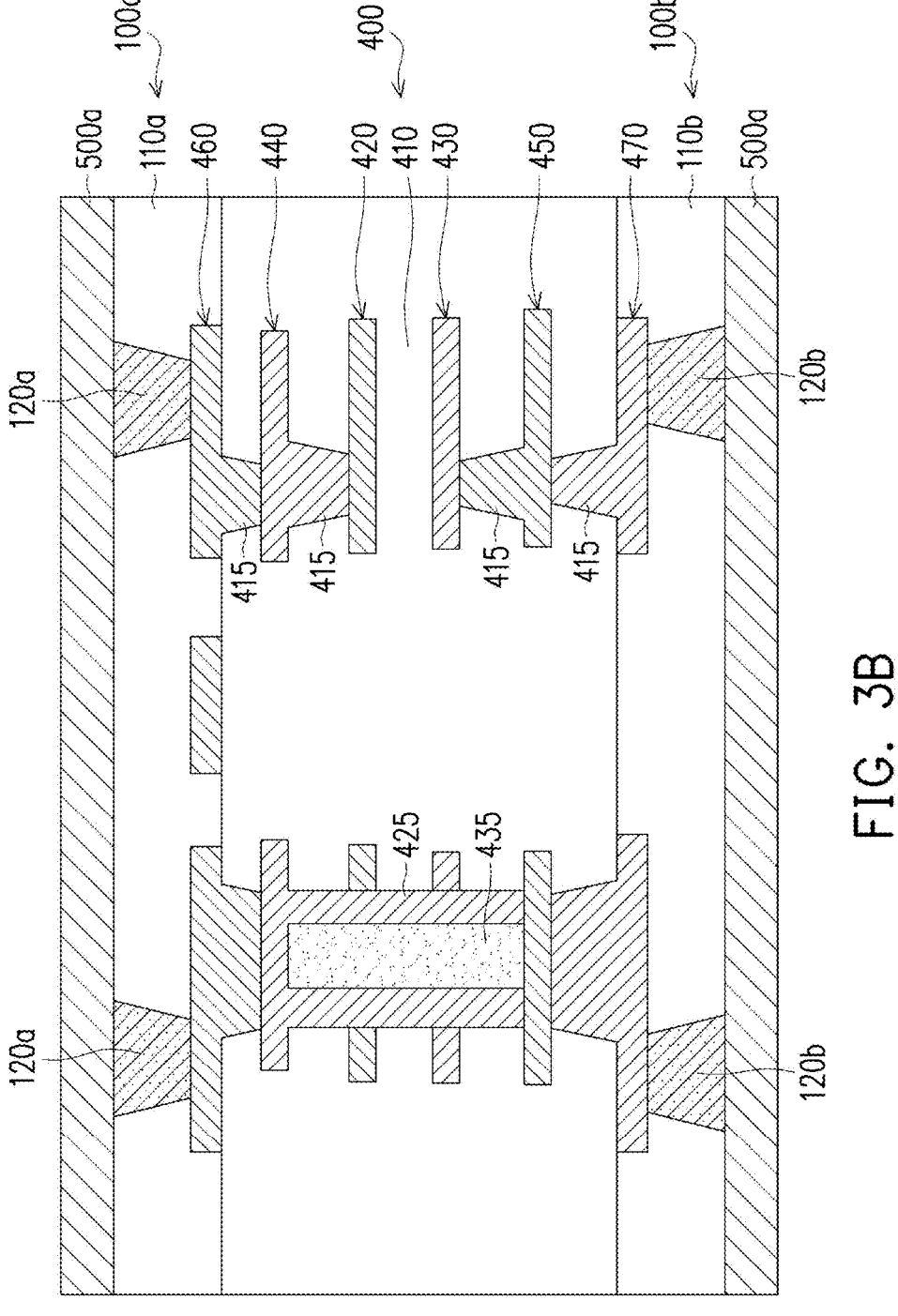
Figure 3C:
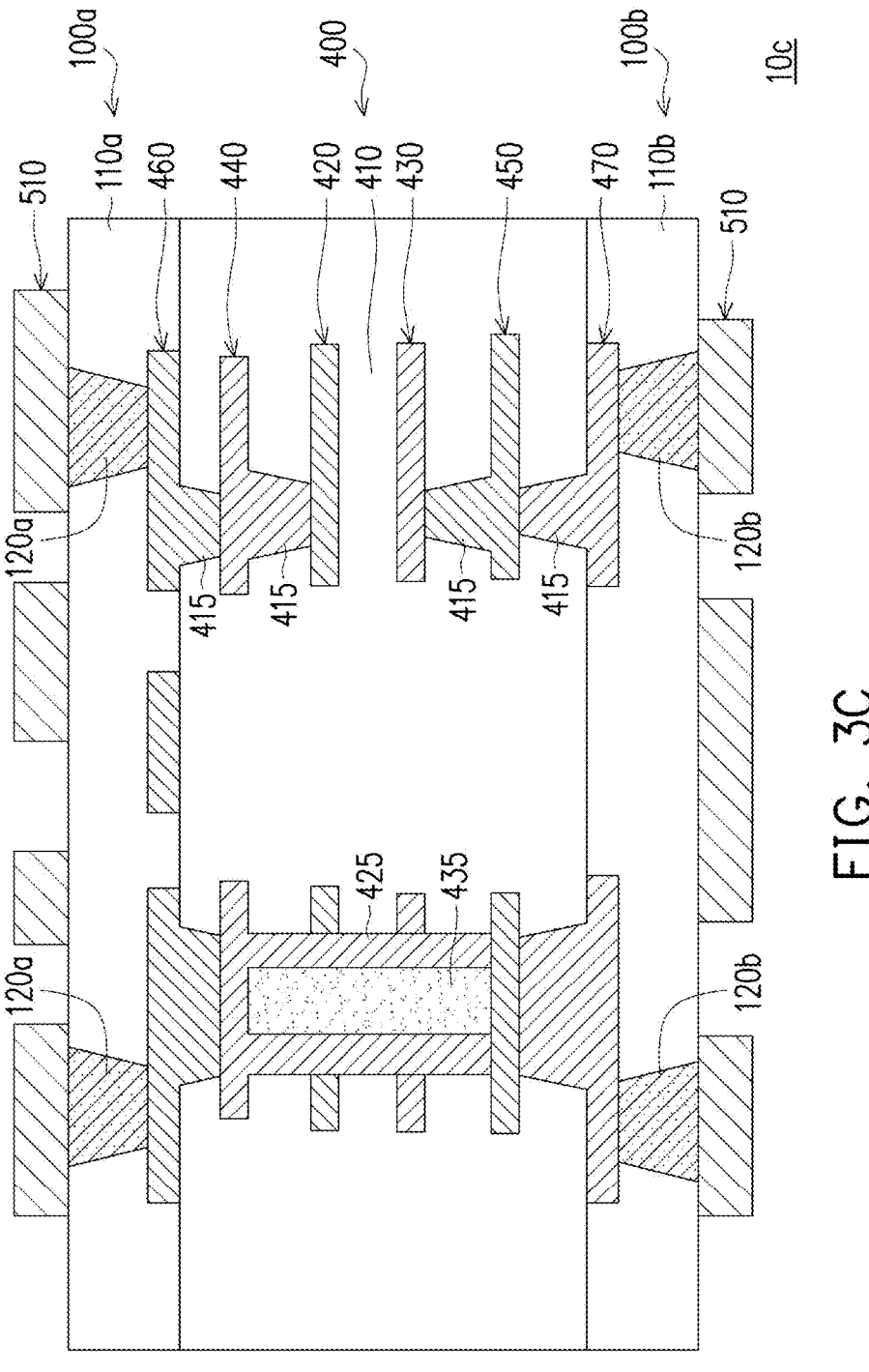

FIG. 3A to FIG. 3C are schematic cross-sectional views of a manufacturing method of a circuit board structure according to another embodiment of the invention. Referring to FIG. 3A and FIG. 1A at the same time, a circuit board structure 10*c* of the present embodiment is similar to the circuit board structure 10*b*. The difference between the two is that a first sub-circuit board 400 of the present embodiment is embodied as a multilayer circuit board. Specifically, in the present embodiment, the first sub-circuit board 400 further includes a plurality of circuit layer 420, 430, 440, 450, 460, 470 and a plurality of dielectric layers 410. The circuit layers 420, 430, 440, 450, 460, 470 and the dielectric layers 410 are alternately arranged, and first conductive through holes 415 penetrate the dielectric layers 410 and are electrically connected to the circuit layers 420 and 440, the circuit layers 440 and 460, the circuit layers 430 and 450, and the circuit layers 450 and 470. Moreover, the first conductive through holes 425 penetrate the plurality of dielectric layers 410 and the circuit layers 420, 430, and are electrically connected to the circuit layers 440, 420, 430, 450, wherein the first conductive through holes 425 are filled with an insulating resin 435.

Next, referring further to FIG. 3A at the same time, a second sub-circuit board 100*a* having a first substrate 110*a* and second conductive through holes 120*a* is provided on the circuit layer 460, and a third sub-circuit board 100*b* having a second substrate 110*b* and third conductive through holes 120*b* is provided on the circuit layer 470. The second conductive through holes 120*a* penetrate the first substrate 110*a*, and the third conductive through holes 120*b* penetrate the second substrate 110*b*. Moreover, a metal layer 500*a* is provided on the surface of the first substrate 110*a* relatively far away from the circuit layer 460 and on the surface of the second substrate 110*b* relatively far away from the circuit layer 470, respectively.

Then, referring to FIG. 3B, the metal layer 500*a*, the second sub-circuit board 100*a*, the first sub-circuit board 400, and the third sub-circuit board 100*b* are laminated so that the second conductive through holes 120*a* are abutted against the circuit layer 460 and electrically connected to the metal layer 500*a* and the circuit layer 460, so that the third conductive through holes 120*b* are abutted against the circuit layer 470 and electrically connected to the metal layer 500*a* and the circuit layer 470. At this point, since the first substrate 110*a* and the second substrate 110*b* are not completely cured and have flexibility and adhesiveness, the first substrate 110*a* and the second substrate 110*b* may be bonded to the first sub-circuit board 400 and squeezed onto the surface of the dielectric layer 410 exposed by the circuit layers 460 and 470. After lamination and curing, the first substrate 110*a* and the second substrate 110*b* may be transformed from the B-stage state to the C-stage state. That is, the second sub-circuit board 100*a* and the third sub-circuit board 100*b* are in a completely cured state, so that the first sub-circuit board 400, the second sub-circuit board 100*a*, and the third sub-circuit board 100*b* are firmly joined together. Lastly, referring to FIG. 3B and FIG. 3C at the same time, the metal layer 500*a* is patterned to form a patterned circuit layer 510 to complete the manufacture of the circuit board structure 10*c*.

In short, the second sub-circuit board 100*a* and the third sub-circuit board 100*b* of the present embodiment may be regarded as a type of interposer, and the states of the first substrate 110*a* and the second substrate 110*b* are changed by a hot pressing method so that the first substrate 110*a* and the second substrate 110*b* are directly bonded on the first sub-circuit board 400. Thereby, no solder and underfill are needed, and the manufacturing cost of the circuit board structure 10*c* may be effectively reduced. Moreover, since solder is not used, the bonding yield among the first sub-circuit board 400, the second sub-circuit board 100*a*, and the third sub-circuit board 100*b* may be effectively improved, thereby improving the structural reliability of the circuit board structure 10*c* of the present embodiment. In addition, via the material properties of the first substrate 110*a* and the second substrate 110*b*, the user may increase the number of the patterned circuit layer 510 according to requirements, thereby increasing the number of layers and applications of the circuit board structure 10c.

Figure 4:
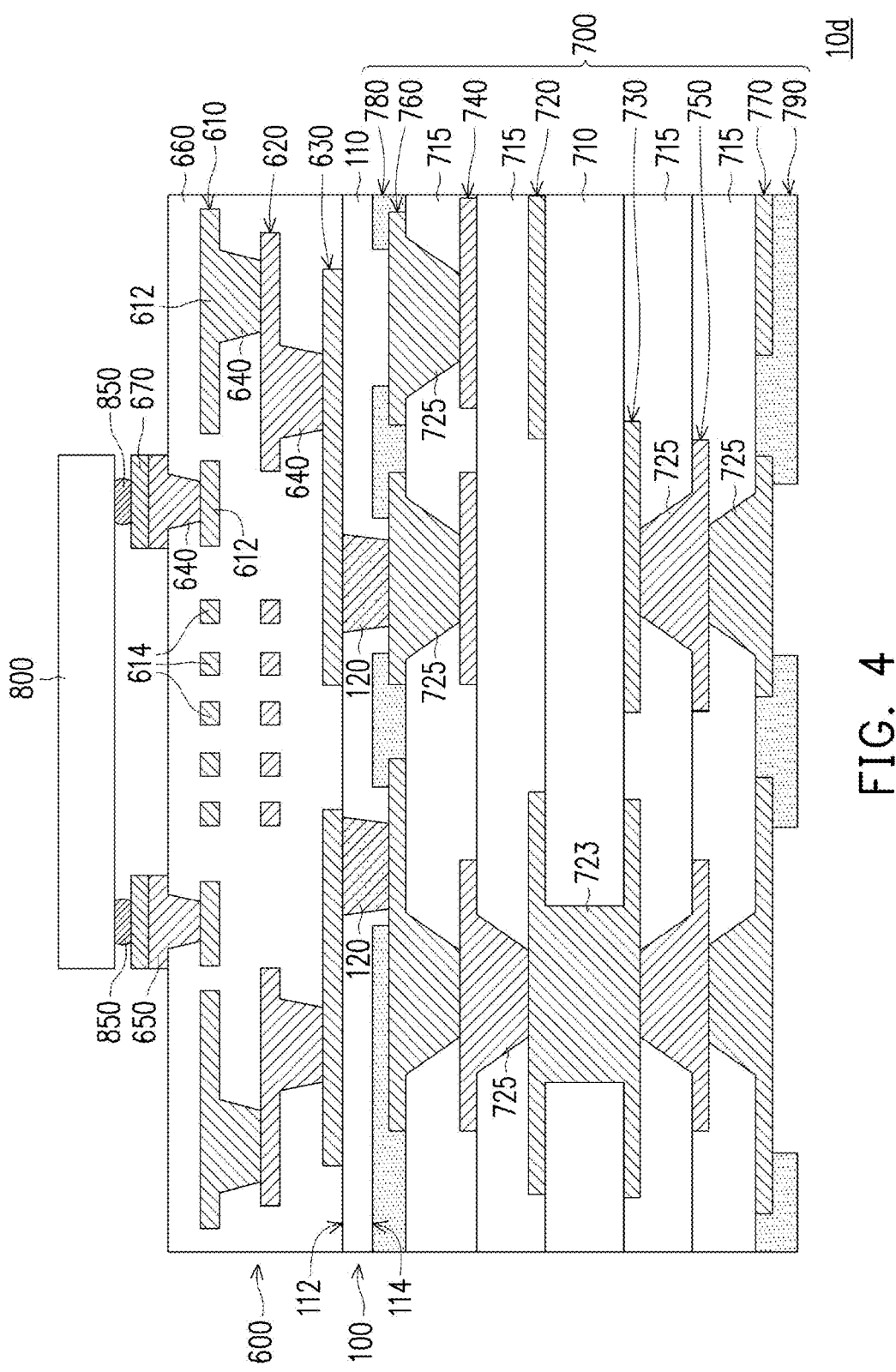
FIG. 4 is a schematic cross-sectional view of an electronic device disposed on another circuit board structure according to an embodiment of the invention.

FIG. 4 is a schematic cross-sectional view of an electronic device disposed on another circuit board structure according to an embodiment of the invention. Referring to FIG. 4 and FIG. 1B at the same time, a circuit board structure 10d of the present embodiment is similar to the circuit board structure 10a. The difference between the two is that a second sub-circuit board 600 of the present embodiment is embodied as a reconfiguration circuit board having a fine circuit. In detail, the second sub-circuit board 600 of the present embodiment includes circuit layers 610, 620, 630, second conductive through holes 640, pads 650, a dielectric layer 660, and surface protection layers 670. The circuit layers 610, 620, 630 and the dielectric layer 660 are alternately arranged, the pads 650 are located on the outermost dielectric layer 660, and the surface protection layers 670 are disposed on the pads 650. The second conductive through holes 640 are electrically connected to the circuit layers 610, 620, 630 and the pads 650. Here, the circuit layer 610 includes a general circuit 612 and a fine circuit 614. An electronic device 800 (for example, a chip) is electrically connected to the surface protection layers 670 on the pads 650 via bumps 850, i.e., flip-chip bonding. The material of the surface protection layers 670 is, for example, ENEPIG, an organic solderability preservative (OSP) layer, or electroless nickel immersion gold (ENIG), but is not limited thereto.

In addition, the structure of a third sub-circuit board 700 of the present embodiment is also different from the third sub-circuit board 300a in FIG. 1B. In detail, the third sub-circuit board 700 of the present embodiment is embodied as a multilayer circuit board. The third sub-circuit board 700 includes a plurality of circuit layers 720, 730, 740, 750, 760, 770, a plurality of dielectric layers 710, 715, a first solder mask 780, and a second solder mask 790. The circuit layers 720, 730, 740, 750, 760, 770 and the dielectric layers 710, 715 are alternately arranged. The first solder mask 780 covers the circuit layer 760 and exposes a portion of the circuit layer 760 as pads electrically connected to the first conductive through holes 120 of the first sub-circuit board 100. The second solder mask 790 covers the circuit layer 770 and exposes a portion of the circuit layer 770 as pads for electrical connection with an external circuit. A first conductive through hole 723 penetrates the dielectric layer 710 and is electrically connected to the circuit layers 720 and 730, and first conductive through holes 725 penetrate the dielectric layer 715 and are electrically connected to the circuit layers 720 and 740, the circuit layers 740 and 760, the circuit layers 730 and 750, and the circuit layers 750 and 770.

In short, the first sub-circuit board 100 of the present embodiment may be regarded as an interposer, and the state of the substrate 110 is changed by a hot pressing method so that the circuit layer 630 and the dielectric layer 660 of the second sub-circuit board 600 and the first solder mask 780 of the third sub-circuit board 700 are directly bonded on the upper surface 112 and the lower surface 114 of the substrate 110. Thereby, no solder and underfill are needed, and the manufacturing cost of the circuit board structure 10d may be effectively reduced. Moreover, since solder is not used, the bonding yield among the first sub-circuit board 100, the second sub-circuit board 600, and the third sub-circuit board 700 may be effectively improved, thereby improving the structural reliability of the circuit board structure 10d of the present embodiment.

Based on the above, in the circuit board structure and the manufacturing method thereof of the invention, the circuit board structure is formed by laminating the first sub-circuit board, the second sub-circuit board, and the third sub-circuit board. At least two of the first conductive through holes, the second conductive through holes, and the third conductive through holes are alternately arranged in the axial direction perpendicular to the extending direction of the first sub-circuit board, and the first sub-circuit board, the second sub-circuit board, and the third sub-circuit board are electrically connected to one another via the first conductive through holes, the second conductive through holes, and the third conductive through holes. Thereby, the manufacturing method of the circuit board structure of the invention does not need to use solder and underfill, thus effectively reducing the manufacturing cost of the circuit board structure. Moreover, since solder is not used, the bonding yield among the first sub-circuit board, the second sub-circuit board, and the third sub-circuit board may be effectively improved, thereby improving the structural reliability of the circuit board structure of the invention.

FIG. 5 is a cross-sectional view of a circuit board structure according to one embodiment of the present disclosure. The circuit board structure 10e includes a glass substrate 1120, an electrode layer 1160, a first sub-circuit board 100 and a first redistribution layer 1300. For example, the glass substrate 1120 may be made of a material that includes silicon, ceramic or sapphire, but it is not limited in this regard. The electrode layer 1160 is located on the glass substrate 1120. The electrode layer 1160 may be made of a material that includes indium tin oxide (ITO), copper or aluminum, but it is not limited in this regard. The circuit board structure 10e further includes a thin-film transistor layer 1140. The thin-film transistor layer is located between the glass substrate 1120 and the electrode layer 1160. In this present disclosure, a combination of the glass substrate 1120, the thin-film transistor layer 1140 and the electrode layer may be regard as a thin-film transistor substrate 1100. The first sub-circuit board 100 is located on the thin-film transistor layer 1140 and the electrode layer 1160, and the first sub-circuit board 100 includes a conductive through hole 120c. The conductive through hole 120c is located in the first sub-circuit board 100 and on the electrode layer 1160. In some embodiment, the first sub-circuit board 100 may be made of a material that includes isolation materials, such as prepreg (PP), ajinomoto buildup film (ABF), bimaleimide triazine (BT) resin, photosensitive dielectric (PID) or incompletely cured polymers, but it is not limited in this regard.

The conductive through hole 120c of the first sub-circuit board 100 may be made of a material that includes conductive metal adhesive manufactured by transient liquid phase sintering (TLPS) coating. The conductive through hole 120c has the effects of electrical and thermal conductivity and is suitable for joining with any metal material, and the conductive through hole 120c is not converted back to liquid by heat. The first redistribution layer 1300 is located on the first sub-circuit board 100 and the conductive through hole 120c, and the conductive through hole 120c electrically connects to the electrode layer 1160 and the first redistribution layer 1300. The first redistribution layer 1300 may be made of a material that includes copper. In detail, the first redistribution layer 1300 may be a copper foil, and the first redistribution layer 1300 shown in FIG. 5 is formed by a tenting process.

In one embodiment, the circuit board structure 10e further includes an antioxidant layer 1400, a pixel unit 1500, and a mold 1600. The antioxidant layer 1400 is located on the first redistribution layer 1300, and the antioxidant layer 1400 may be made of a material that includes gold. The antioxidant layer 1400 covers a top surface of the first redistribution layer 1300 to provide an antioxidant effect. The pixel unit 1500 is located on the antioxidant layer 1400, and the pixel unit 1500 may electrically connect to the first redistribution layer 1300 and the antioxidant layer 1400. The mold 1600 is located on the first sub-circuit board 100, the antioxidant layer 1400 and the pixel unit 1500. The mold 1600 covers the first sub-circuit board 100, the antioxidant layer 1400 and the pixel unit 1500 to provide isolation and protection effects.

In detail, the first sub-circuit board 100 of the circuit board structure 10e may bond to the electrode layer 1160 and the first redistribution layer 1300, that is, the first sub-circuit board 100 may be regarded as a connection structure for bonding to the electrode layer 1160 and the first redistribution layer 1300 to improve the bonding force. Moreover, since the conductive through hole 120c of the first sub-circuit board 100 only needs to be filled with the conductive metal adhesive to connect with the electrode layer 1160 and the first redistribution layer 1300, which is no need to perform the electroplating process to fill the conductive through hole 120c. It may save the cost of using electroplating equipment and be environmental. In addition, the conductive through hole 120c of the first sub-circuit board 100 is connected to the electrode layer 1160 and the first redistribution layer 1300 by filling with the conductive metal adhesive, instead of performing the electroplating process to fill the conductive through hole 120c. Stress may be reduced when the first sub-circuit board 100 bonds to the electrode layer 1160 and the first redistribution layer 1300, and the glass substrate 1120 will not be curved. The first sub-circuit board 100 and the first redistribution layer 1300 may be used as bonding pads to provide a stable effect for the pixel unit 1500. Compared with the traditional technology, the first redistribution layer 1300 has a better bonding force to metal, and the first redistribution layer 1300 may be used as a bonding pad, so the structural reliability between the first redistribution layer 1300 and the pixel unit 1500 may increase.

It is to be noted that the connection relationship of the aforementioned elements will not be repeated. In the following description, other types of circuit board structures will be described.

Figure 6:
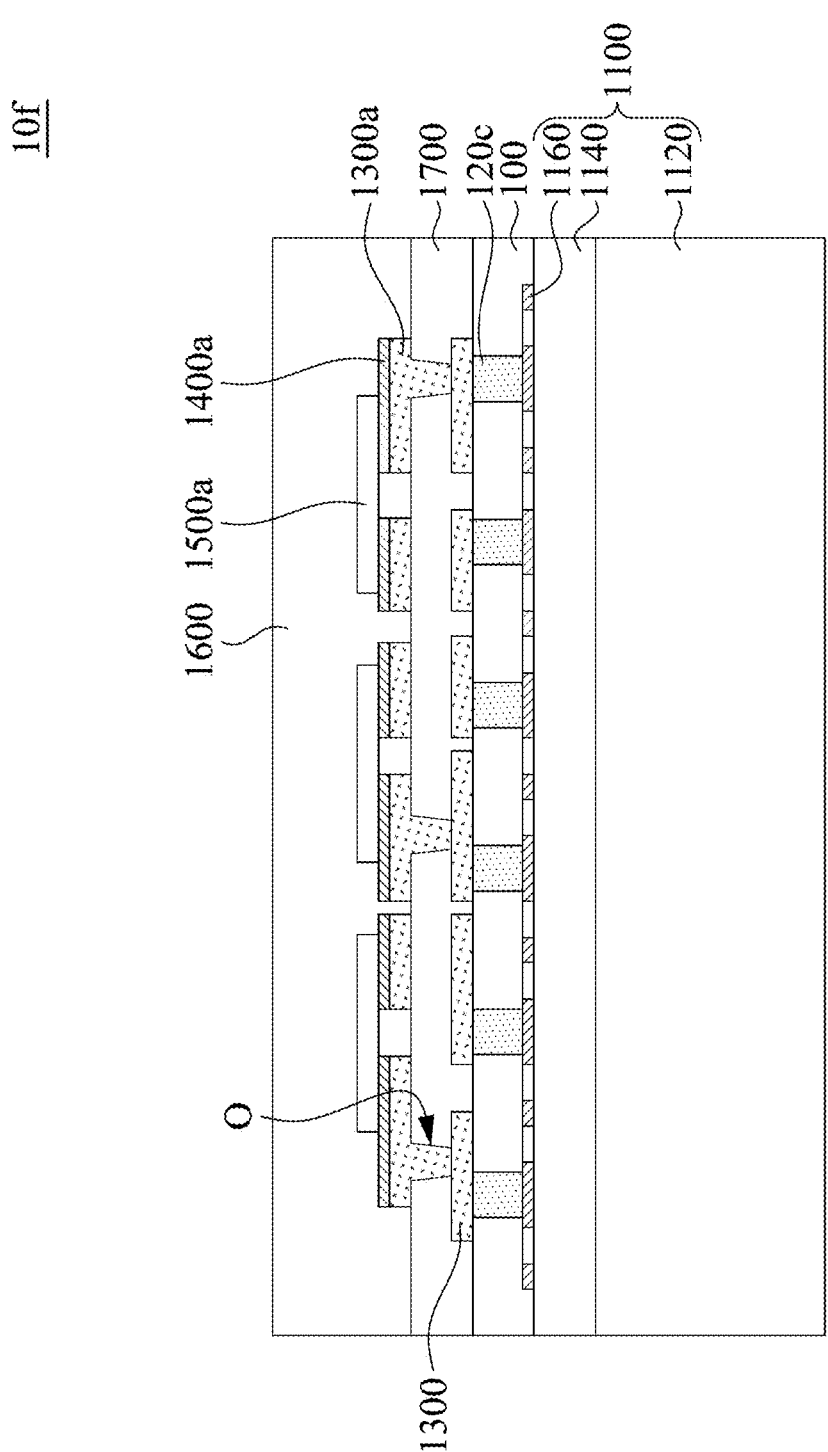
FIG. 6 is a cross-sectional view of a circuit board structure according to another embodiment of the present disclosure.

FIG. 6 is a cross-sectional view of a circuit board structure according to another embodiment of the present disclosure. The circuit board structure 10f includes the glass substrate 1120, the electrode layer 1160, the first sub-circuit board 100, and the first redistribution layer 1300. The circuit board structure 10f further includes the thin-film transistor layer 1140. The combination of the glass substrate 1120, the thin-film transistor layer 1140, and the electrode layer 1160 may be regarded as the thin-film transistor substrate 1100. The first sub-circuit board 100 has the conductive through hole 120c. The difference between this embodiment and the embodiment shown in FIG. 5 is that the circuit board structure 10f further includes a dielectric layer 1700 and a second redistribution layer 1300a. The dielectric layer 1700 is located on the first sub-circuit board 100 and the first redistribution layer 1300. For example, the dielectric layer 1700 may be made of a material that includes dielectric materials. The second redistribution layer 1300a is located on the dielectric layer 1700, and the second redistribution layer 1300a extends to the first redistribution layer 1300 in an opening O, that is, the conductive through hole 120c, the first redistribution layer 1300, and the second redistribution layer 1300a electrically connect to each other. For example, the first redistribution layer 1300 and the second redistribution layer 1300a may have a same material.

The circuit board structure 10f further includes an antioxidant layer 1400a, a pixel unit 1500a, and the mold 1600. The antioxidant layer 1400a is located on the second redistribution layer 1300a, and the antioxidant layer 1400a may be made of a material that includes gold. The antioxidant layer 1400a may be formed on the second redistribution layer 1300a by electroless plating. The pixel unit 1500a is located on the antioxidant layer 1400a. The mold 1600 is located on the antioxidant layer 1400a, the pixel unit 1500a and the dielectric layer 1700. The first sub-circuit board 100 of the circuit board structure 10f may bond to the electrode layer 1160 and the first redistribution layer 1300 to improve the bonding force, and the conductive through hole 120c of the first sub-circuit board 100, the first redistribution layer 1300 and the second redistribution layer 1300a may form a multilayer connection structure. The conductive through hole 120c of the first sub-circuit board 100 electrically connects to the electrode layer 1160, the first redistribution layer 1300 and the second redistribution layer 1300a.

In the following description, a manufacturing method of the circuit board structure 10e (see FIG. 5) and the circuit board structure 10f (see FIG. 6) will be described. It is to be noted that the connection relationship of the aforementioned elements will not be repeated.

FIG. 7 is a flow chart of a manufacturing method of a circuit board structure according to one embodiment of the present disclosure. The manufacturing method of the circuits board structure includes steps as outlined below. In step S1, a glass substrate is formed, wherein the glass substrate comprises an electrode layer, and the electrode layer is located on the glass substrate. In step S2, a first sub-circuit board is formed, wherein the first sub-circuit board comprises a fourth conductive through hole. In step S3, the glass substrate, the first sub-circuit board and a first redistribution layer are laminated such that the first sub-circuit board is located between the glass substrate and the first redistribution layer, wherein the fourth conductive through hole electrically connects to the electrode layer and the first redistribution layer. In the following description, the aforementioned steps will be described in detail.

Figure 8:
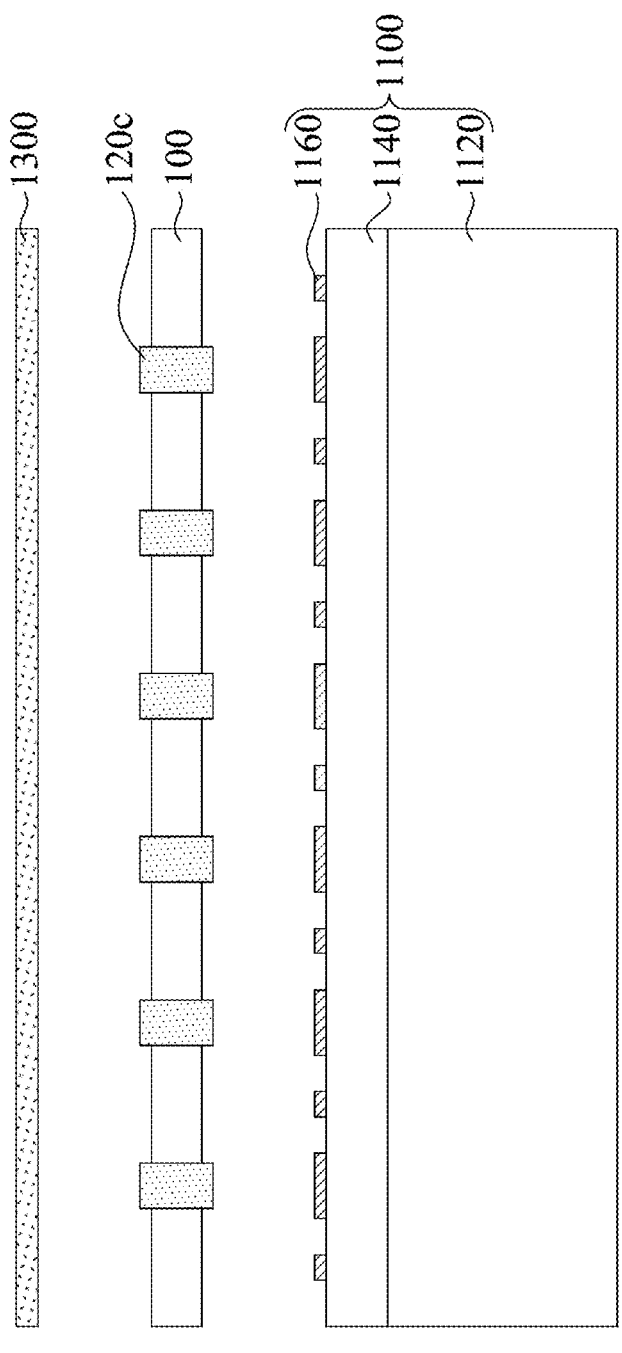
FIG. 8 to FIG. 10 are cross-sectional views at various steps of a manufacturing method of a circuit board structure according to one embodiment of the present disclosure.
Figure 9:
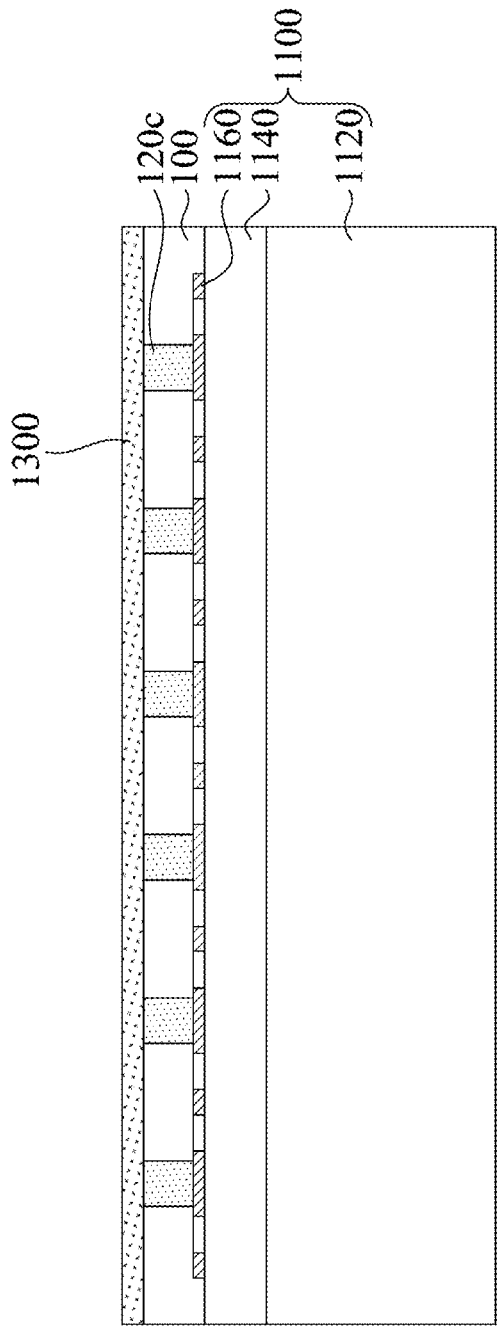
Figure 10:
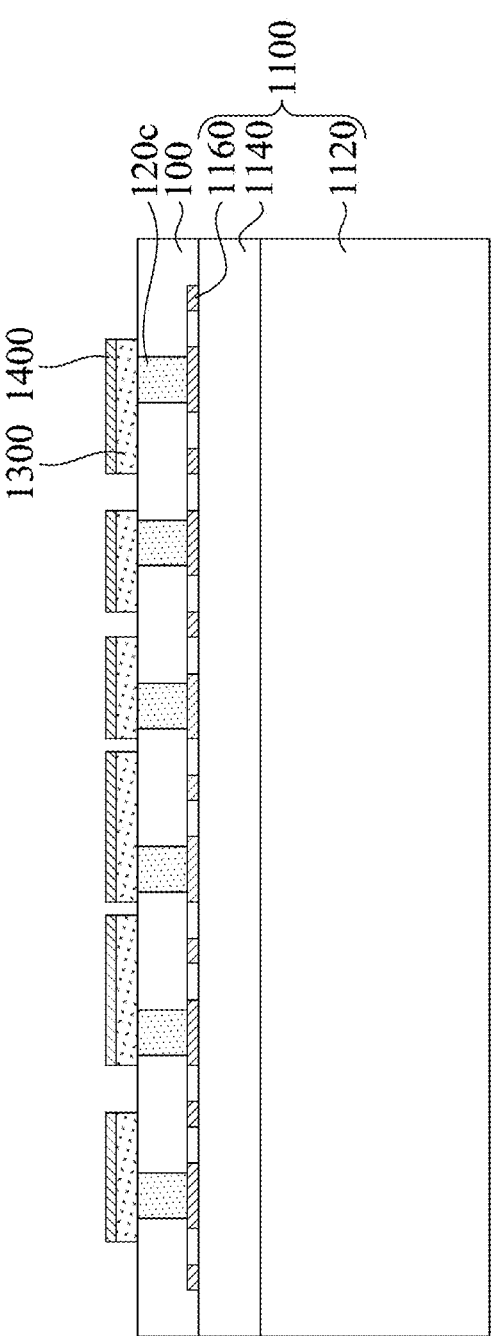

FIG. 8 to FIG. 10 are cross-sectional views at various steps of a manufacturing method of a circuit board structure according to one embodiment of the present disclosure. Referring to FIG. 8, the glass substrate 1120 and the thin-film transistor layer 1140 are formed. The glass substrate 1120 has the electrode layer 1160, the thin-film transistor layer 1140 is located on the glass substrate 1120, and the electrode layer 1160 is located on the thin-film transistor layer 1140. In present disclosure, the combination of the glass substrate 1120, the thin-film transistor layer 1140 and the electrode layer 1160 may be regarded as the thin-film transistor substrate 1100. Next, the first sub-circuit board 100 is formed. Before a hot pressing method, the first sub-circuit board 100 is in the B-stage state, and the first sub-circuit board 100 may be drilled and filled with the conductive metal adhesive to form the conductive through hole 120c.

Next, the first redistribution layer 1300 is formed. In some embodiments, the first redistribution layer 1300 may be made of a material that includes copper. In detail, the first redistribution layer 1300 may be a copper foil, so the first redistribution layer 1300 has high coplanar characteristics. Before the glass substrate 1120, the first sub-circuit board 100 and the first redistribution layer 1300 are laminated, the first sub-circuit board 100 is in the B-stage state and has flexibility and adhesiveness, so the first sub-circuit board 100 may be used to bond the thin-film transistor substrate 1100 and the first redistribution layer 1300.

Referring to FIG. 9, next, the glass substrate 1120, the first sub-circuit board 100, and the first redistribution layer 1300 are laminated so that the first sub-circuit board 100 is located between the thin-film transistor substrate 1100 and the first redistribution layer 1300, wherein the conductive through hole 120*c*, the electrode layer 1160 and the first redistribution layer 1300 are electrically connected. Then, after the glass substrate 1120, the first sub-circuit board 100, and the first redistribution layer 1300 are laminated, the first sub-circuit board 100 may be transformed from the B-stage state to the C-stage state by applying a hot pressing method. In this way, the first sub-circuit board 100 firmly connects to the thin-film transistor substrate 1100 and the first redistribution layer 1300 to increase the structural reliability.

Referring to FIG. 10, in some embodiments, the method further includes patterning the first redistribution layer 1300, and forming the antioxidant layer 1400 on the first redistribution layer 1300 by electroless plating, wherein the antioxidant layer 1400 may be made of a material that includes gold. The antioxidant layer 1400 covers a top surface of the first redistribution layer 1300 to provide an antioxidant effect.

Next, referring back to FIG. 5, the method further includes disposing the pixel unit 1500 on the antioxidant layer 1400, and forming the mold 1600 on the pixel unit 1500, the antioxidant layer 1400 and the first sub-circuit board 100 to form the circuit board structure 10*e*. The mold 1600 covers the first sub-circuit board 100, the antioxidant layer 1400 and the pixel unit 1500 to provide insulation and protection effects and to increase the structural reliability of the circuit board structure 10*e*. Specifically, the manufacturing method of this embodiment does not need to use solder paste and solder adhesive, which can effectively reduce the manufacturing cost of the circuit board structure 10*e*. In addition, because no solder paste is used, the bonding yield between the thin-film transistor substrate 1100, the first sub-circuit board 100 and the first redistribution layer 1300 may be effectively improved, thereby improving the structural reliability of the circuit board structure 10*e*.

Figure 11:
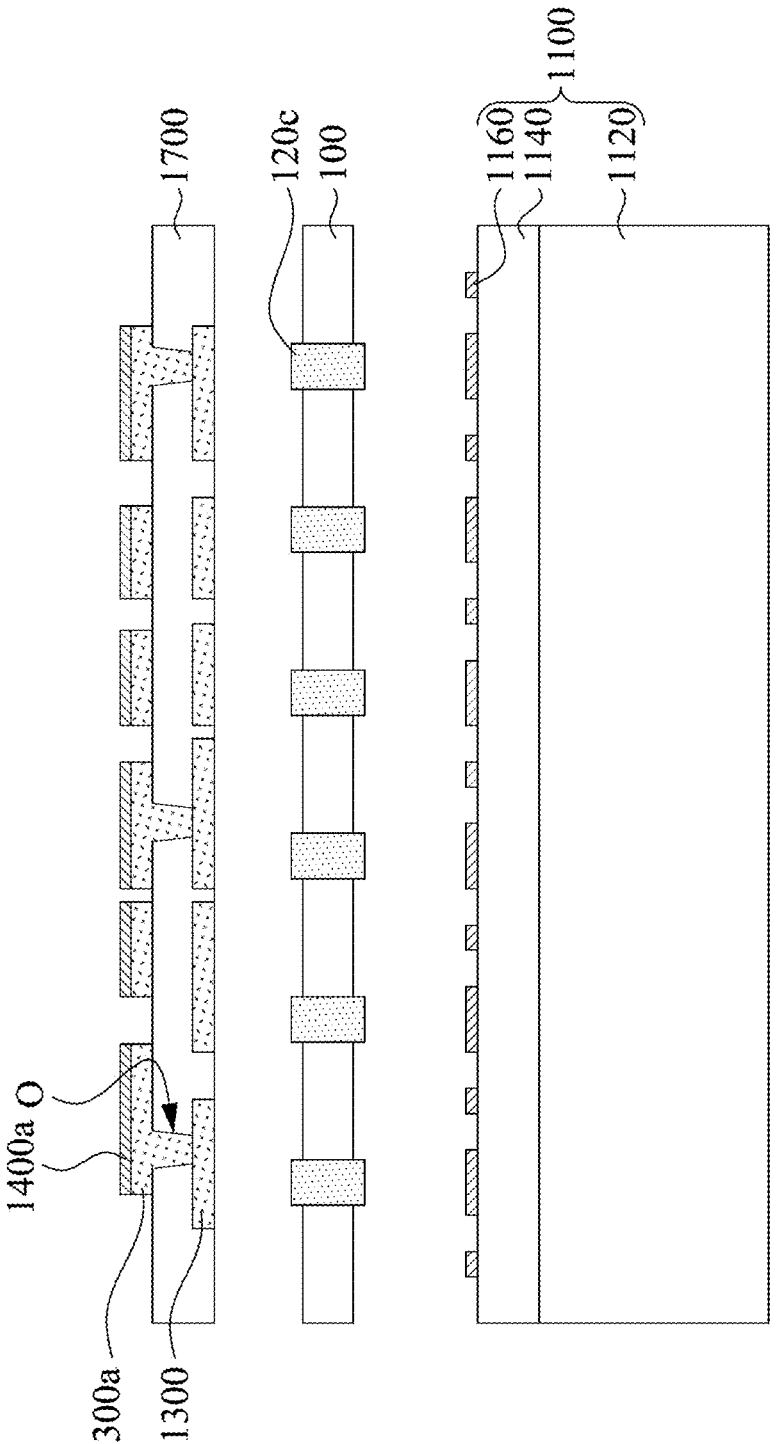
FIG. 11 to FIG. 12 are cross-sectional views at various steps of a manufacturing method of a circuit board structure according to another embodiment of the present disclosure.
Figure 12:
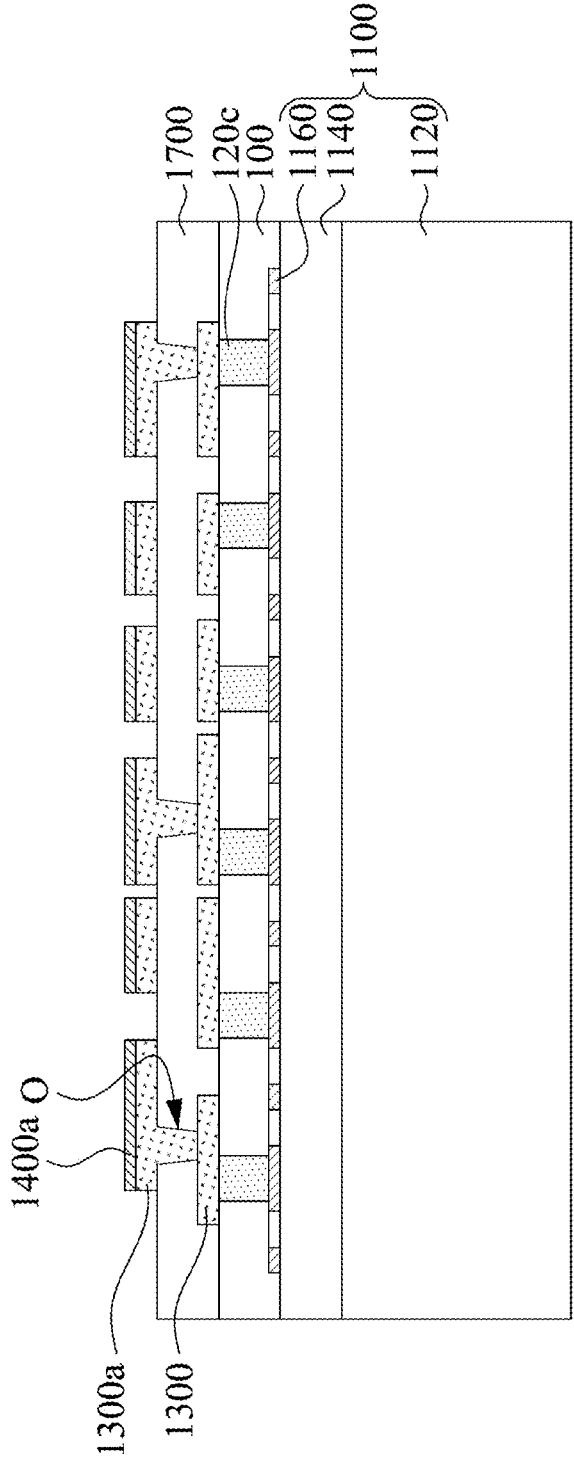

FIG. 11 to FIG. 12 are cross-sectional views at various steps of a manufacturing method of a circuit board structure according to another embodiment of the present disclosure. Referring to FIG. 11, the difference between this embodiment and the embodiment shown in FIG. 8 is that before laminating the glass substrate 1120, the first sub-circuit board 100, and the first redistribution layer 1300, the method further includes: patterning the first redistribution layer 1300; forming the dielectric layer 1700 on the first redistribution layer 1300; forming the opening O in the dielectric layer 1700; and forming the second redistribution layer 1300*a* on the dielectric layer 1700. The second redistribution layer 1300*a* extends to the first redistribution layer 1300 in the opening O. In addition, the method further includes forming the antioxidant layer 1400*a* on the second redistribution layer 1300*a* by electroless plating. The antioxidant layer 1400*a* may be made of a material that includes gold. The antioxidant layer 1400*a* covers a top surface of the second redistribution layer 1300*a* to provide an antioxidant effect.

Next, referring to FIG. 12, the glass substrate 1120, the first sub-circuit board 100 and the first redistribution layer 1300 are laminated so that the first sub-circuit board 100 is located between the thin-film transistor substrate 1100 and the first redistribution layer 1300. The conductive through hole 120*c* electrically connects to the electrode layer 1160, the first redistribution layer 1300, and the second redistribution layer 1300*a* to form a multilayer connection structure. Since the first sub-circuit board 100 is in the B-stage state and has flexibility and adhesiveness, the first sub-circuit board 100 may bond to the thin-film transistor substrate 1100 and the first redistribution layer 1300.

Next, referring back to FIG. 6, in some embodiments, the method further includes disposing the pixel unit 1500*a* on the antioxidant layer 1400*a* and forming the mold 1600 on the antioxidant layer 1400*a*, the pixel unit 1500*a* and the dielectric layer 1700. In this way, the circuit board structure 10*f* as shown in FIG. 6 may be obtained. Specifically, the manufacturing method of the circuit board structure 10*f* does not need to use solder paste and solder adhesive, which can effectively reduce the manufacturing cost of the circuit board structure 10*f*. In addition, since no solder paste is used, the bonding yield between the thin-film transistor substrate 1100, the first sub-circuit board 100 and the first redistribution layer 1300 may be effectively improved, thereby improving the structural reliability of the circuit board structure 10*f*.

In one embodiment, the first sub-circuit board 100 of the circuit board structure 10*f* may bond to the electrode layer 1160 and the first redistribution layer 1300 to improve the bonding force, and the conductive through hole 120*c* of the first sub-circuit board 100 electrically connects to the electrode layer 1160, the first redistribution layer 1300 and the second redistribution layer 1300*a*, so the circuit board structure 10*f* has a multilayer connection structure.

In the following description, a manufacturing method of another circuit board structure will be described. It is to be noted that the connection relationship of the aforementioned elements will not be repeated.

Figure 13:
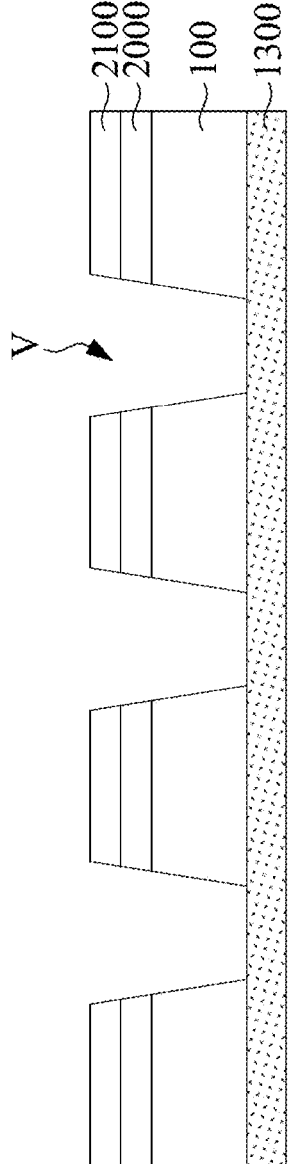
FIG. 13 to FIG. 17 are cross-sectional views at various steps of a manufacturing method of a circuit board structure according to yet another embodiment of the present disclosure.

FIG. 13 to FIG. 17 are cross-sectional views at various steps of a manufacturing method of a circuit board structure according to yet another embodiment of the present disclosure. Referring to FIG. 13, the first redistribution layer 1300 and a pressure-sensitive adhesive (PSA) layer 2000 are formed on opposite sides of the first sub-circuit board 100, respectively. Next, a polyethylene terephthalate (PET) adhesive layer 2100 is pasted on the PSA layer 2000 of the first sub-circuit board 100. Next, the first sub-circuit board 100, the PSA layer 2000, and the PET adhesive layer 2100 are laser-drilled to make the first sub-circuit board 100 have a through hole V to form the structure as shown in FIG. 13.

Figure 14:
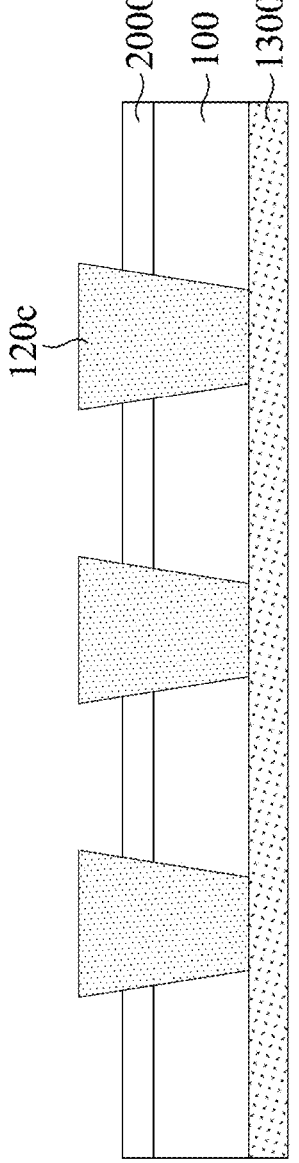

Referring to both FIG. 13 and FIG. 14, the conductive metal adhesive is filled in the through hole V to form the conductive through hole 120*c* in the first sub-circuit board 100. After the conductive via 120*c* is formed, the PET adhesive layer 2100 may be removed to form the structure shown in FIG. 14.

Figure 15:
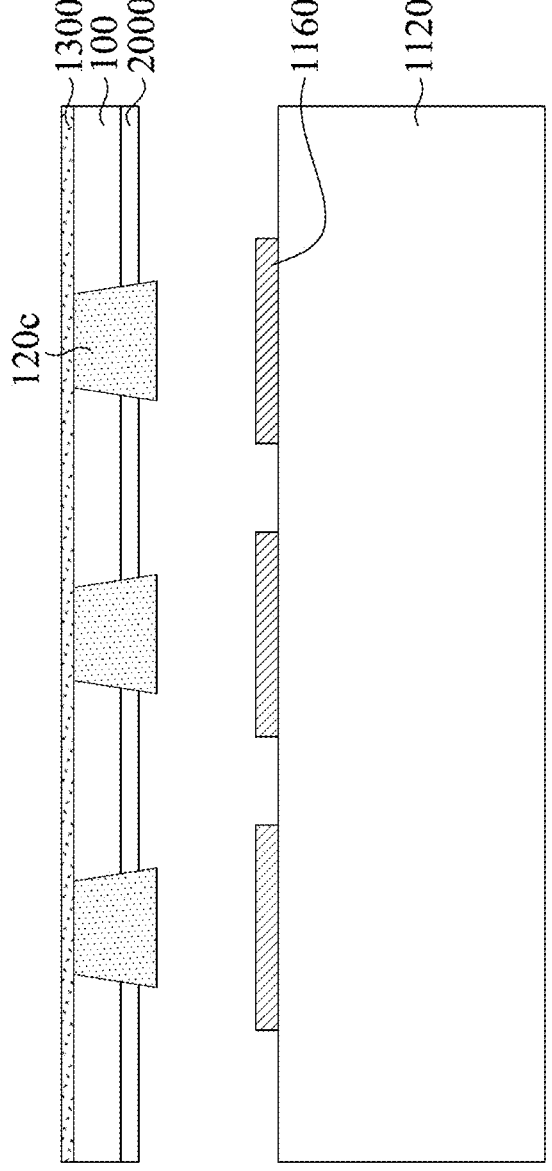

Referring to FIG. 15, next, the glass substrate 1120 is formed, the glass substrate 1120 includes the electrode layer 1160, and the electrode layer 1160 is located on the glass substrate 1120. Next, the structure shown in FIG. 14 is turned upside down by 90 degrees, so the conductive through hole 120*c* is closer to the electrode layer 1160 than the first redistribution layer 1300.

Figure 16:
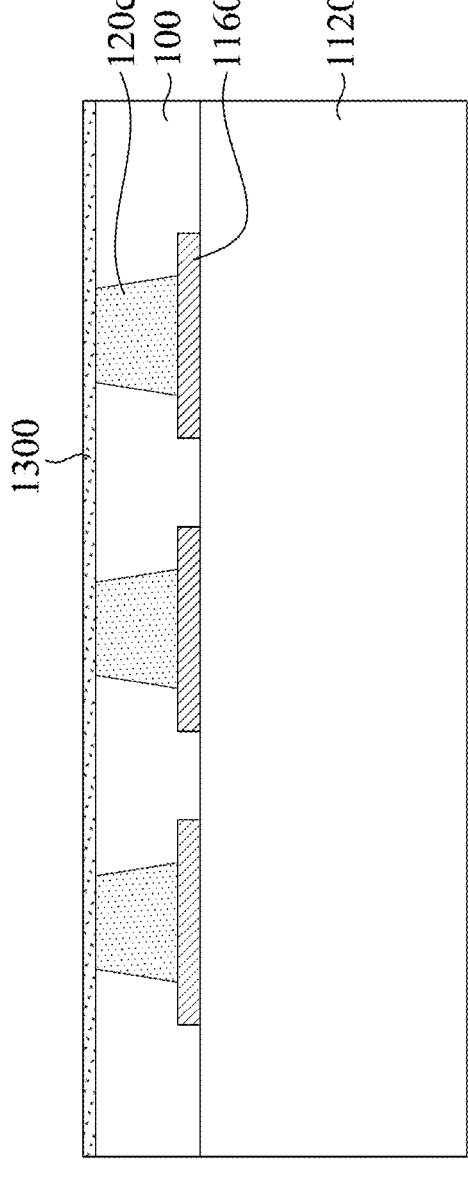

Referring to both FIG. 15 and FIG. 16, after the PSA layer 2000 of the first sub-circuit board 100 is removed, the glass substrate 1120, the first sub-circuit board 100 and the first redistribution layer 1300 are laminated so that the first sub-circuit board 100 is located between the glass substrate 1120 and the first redistribution layer 1300, and the conductive through hole 120c electrically connects to the electrode layer 1160 and the first redistribution layer 1300.

Figure 17:
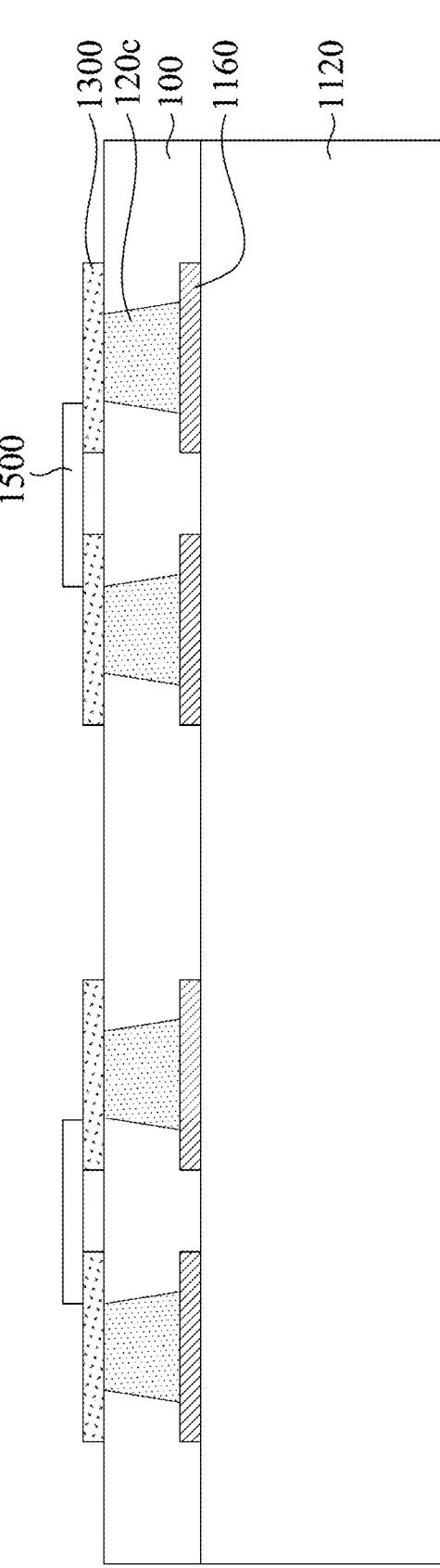

Referring to FIG. 17, next, the first redistribution layer 1300 is etched to form a circuit. After the first redistribution layer 1300 forms the circuit, the pixel unit 1500 is formed on the first redistribution layer 1300 to form the circuit board structure 10g as shown in FIG. 17. Next, the mold 1600 as shown in FIG. 5 may be formed on the pixel unit 1500 and the first sub-circuit board 100 to cover the pixel unit 1500 and the first sub-circuit board 100.

In the following description, other types of a circuit board structure will be described. It is to be noted that the connection relationship of the aforementioned elements will not be repeated.

Figure 18:
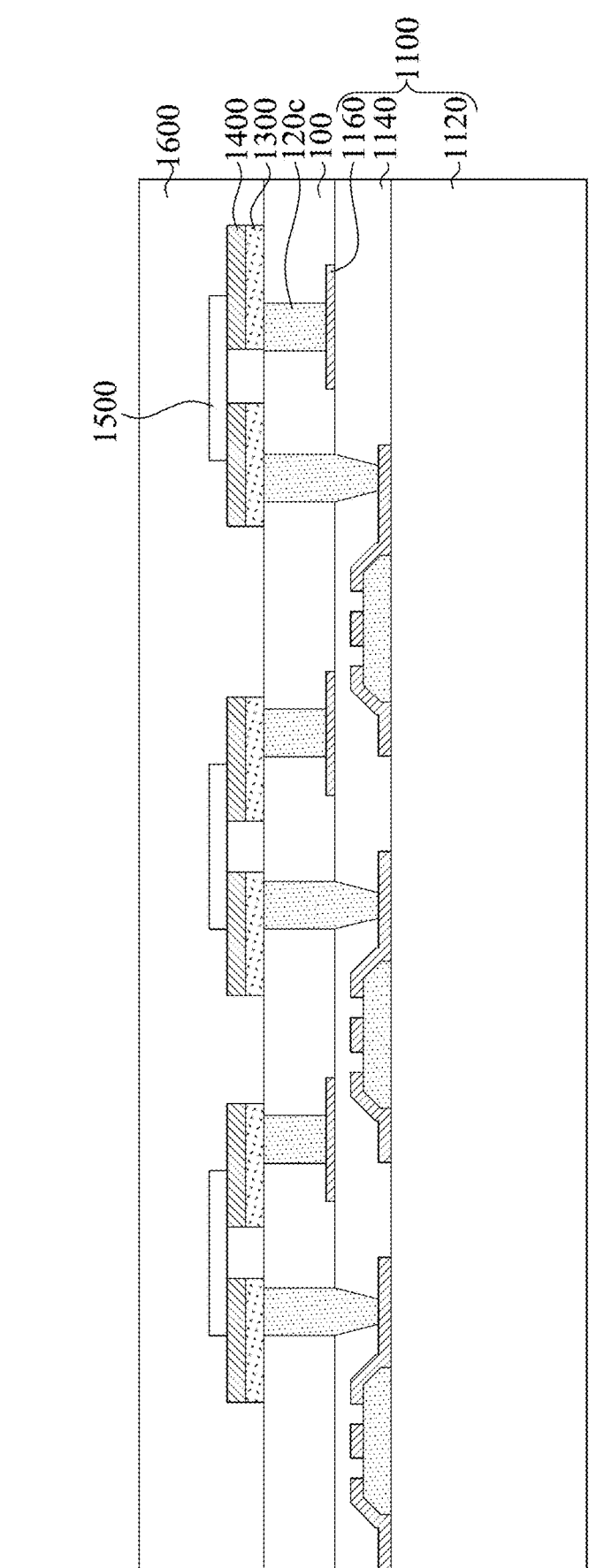
FIG. 18 is a cross-sectional view of a circuit board structure according to yet another embodiment of the present disclosure.

FIG. 18 is a cross-sectional view of a circuit board structure according to yet another embodiment of the present disclosure. Referring to FIG. 18, the difference between this embodiment and the embodiment shown in FIG. 5 is that the thin-film transistor layer 1140 has a thin-film transistor structure for active driving, and the conductive through hole 120c not only electrically connects to the electrode layer 1160 and the first redistribution layer 1300, but also extends into the thin-film transistor layer 1140 to electrically connect to the thin-film transistor layer 1140 that is actively driven. The combination of the glass substrate 1120, the thin-film transistor layer 1140, and the electrode layer 1160 may be regarded as the thin-film transistor substrate 1100. In addition, the manufacturing process of the circuit board structure 10h is similar to the manufacturing process shown in FIGS. 9 and 10 except that the manufacturing process of the glass substrate 1120 and the thin-film transistor layer 1140 are different.

Figure 19:
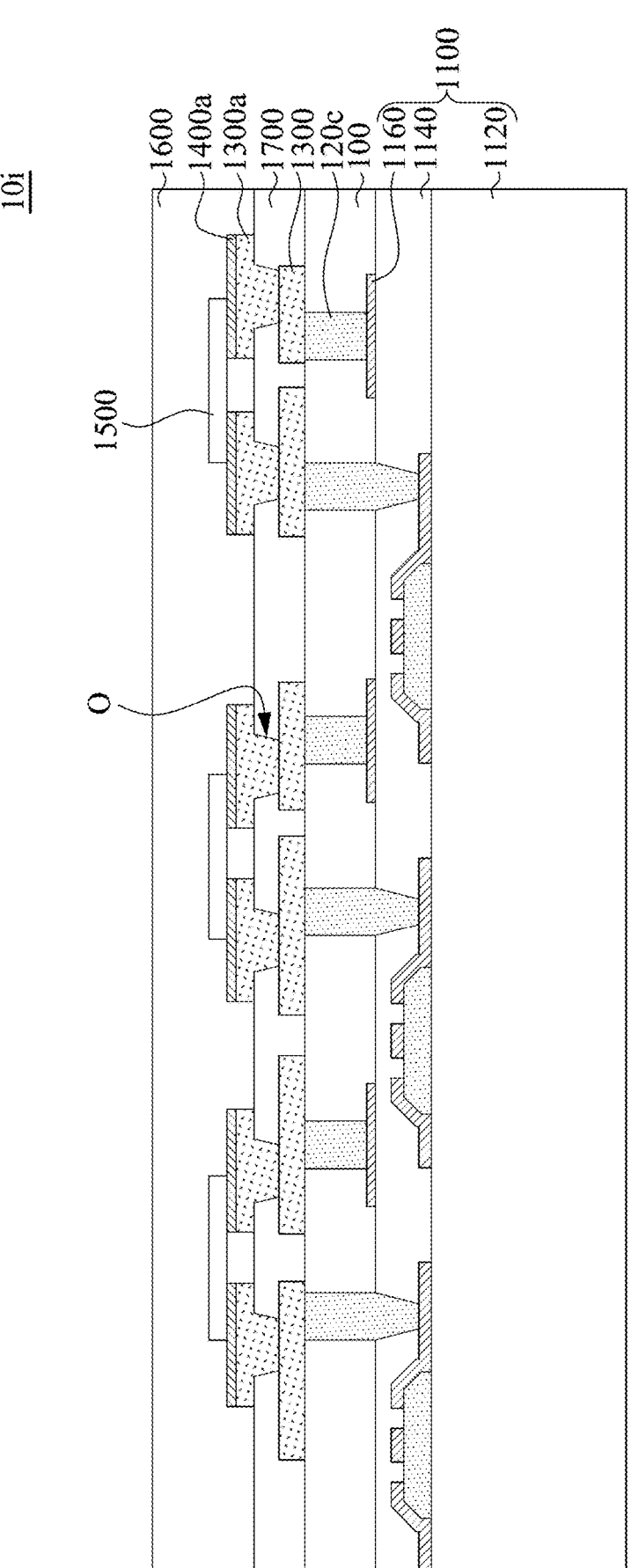
FIG. 19 is a cross-sectional view of a circuit board structure according to yet another embodiment of the present disclosure.

FIG. 19 is a cross-sectional view of a circuit board structure according to yet another embodiment of the present disclosure. Referring to FIG. 19, the difference between this embodiment and the embodiment shown in FIG. 10 is that the thin-film transistor layer 1140 has a thin-film transistor structure applied to active driving, and the conductive through hole 120c not only electrically connects to the electrode layer 1160 and the first redistribution layer 1300, but also extends into the thin-film transistor layer 1140. The conductive through hole 120c electrically connects to the thin-film transistor layer 1140, the electrode layer 1160, the first redistribution layer 1300, and the second redistribution layer 1300a to form a multilayer connection structure. In addition, the manufacturing process of the circuit board structure 10i is similar to the manufacturing process shown in FIGS. 11 and 12 except that the manufacturing process of the glass substrate 1120 and the thin-film transistor layer 1140 are different.

In detail, since the conductive through hole 120c of the first sub-circuit board 100 only needs to be filled with the conductive metal adhesive to connect with the electrode layer 1160 and the first redistribution layer 1300, which is no need to perform an electroplating process to fill the conductive through hole 120c. It may save the cost of using electroplating equipment and be environmental.

Figure 20:
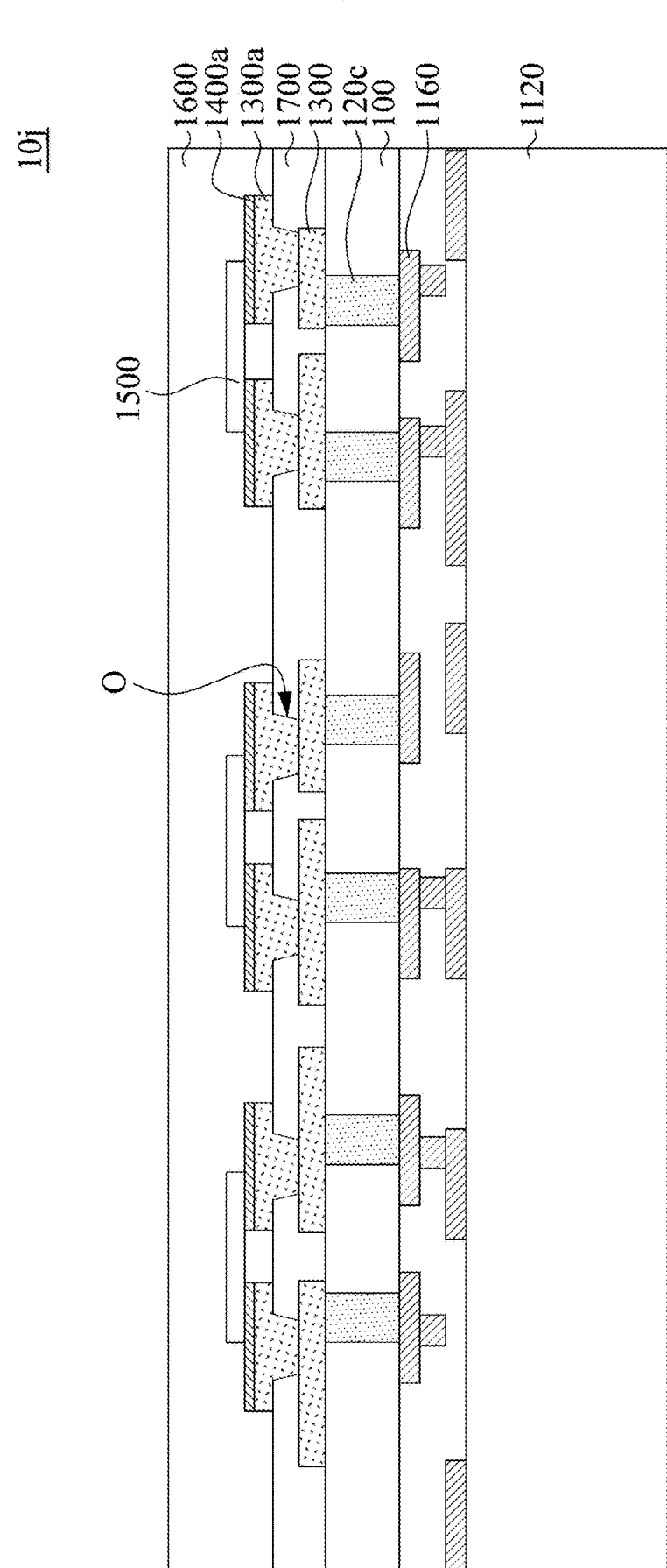
FIG. 20 is a cross-sectional view of a circuit board structure according to yet another embodiment of the present disclosure.

FIG. 20 is a cross-sectional view of a circuit board structure according to yet another embodiment of the present disclosure. Referring to FIG. 20, the difference between this embodiment and the embodiment shown in FIG. 10 is that the glass substrate 1120 does not include the thin-film transistor layer 1140 (see FIG. 10), and the electrode layer 1160 is a multilayer structure. The electrode layer 1160 may be regarded as a redistribution structure. The circuit board structure 10j may be used in a passive driving circuit. In addition, the circuit board structure 10j is similar to the manufacturing process in FIGS. 11 and 12 except for the manufacturing process of the glass substrate 1120 and the electrode layer 1160.

In detail, the conductive through hole 120c of the first sub-circuit board 100 is connected to the electrode layer 1160 and the first redistribution layer 1300 by filling with the conductive metal adhesive, instead of performing the electroplating process to fill the conductive through hole 120c, therefore the stress may be reduced when the first sub-circuit board 100 bonds to the electrode layer 1160 and the first redistribution layer 1300, and the glass substrate 1120 will not be curved.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A manufacturing method of a circuit board structure, comprising:

forming a glass substrate, wherein the glass substrate comprises an electrode layer, and the electrode layer is located on the glass substrate;

forming a first sub-circuit board, wherein the first sub-circuit board comprises a conductive through hole; and laminating the glass substrate, the first sub-circuit board and a first redistribution layer such that the first sub-circuit board is located between the glass substrate and the first redistribution layer, wherein the conductive through hole electrically connects to the electrode layer and the first redistribution layer, wherein before laminating the glass substrate, the first sub-circuit board and the first redistribution layer, the first sub-circuit board is in a B-stage state, and the method further comprises performing a hot pressing method to transform the first sub-circuit board from the B-stage state to a C-stage state after laminating the glass substrate, the first sub-circuit board and the first redistribution layer.

2. The manufacturing method of the circuit board structure of claim 1, further comprising:

patterning the first redistribution layer;

forming an antioxidant layer on the first redistribution layer by electroless plating, wherein the antioxidant layer is made of a material comprising gold;

disposing a pixel unit on the antioxidant layer; and forming a mold on the pixel unit, the antioxidant layer and the first sub-circuit board.

3. The manufacturing method of the circuit board structure of claim 1, wherein before laminating the glass substrate, the first sub-circuit board and the first redistribution layer, the method further comprises:

patterning the first redistribution layer;

forming a dielectric layer on the first redistribution layer;

forming an opening in the dielectric layer; and forming a second redistribution layer on the dielectric layer; wherein the second redistribution layer extends to the first redistribution layer in the opening.

4. The manufacturing method of the circuit board structure of claim 3, further comprising:

forming an antioxidant layer on the second redistribution layer by electroless plating, wherein the antioxidant layer is made of a material comprising gold;

disposing a pixel unit on the antioxidant layer; and forming a mold on the pixel unit, the antioxidant layer and the dielectric layer.

5. The manufacturing method of the circuit board structure of claim 1, forming the first sub-circuit board comprising:

laser-drilling the first sub-circuit board such that the first sub-circuit board has a through hole; and filling the through hole with a conductive metal adhesive to form the conductive through hole in the first sub-circuit board.

\* \* \* \* \*